United States Patent [19]
Mokuo

[11] Patent Number: 5,666,381
[45] Date of Patent: Sep. 9, 1997

[54] COMMUNICATION SYSTEM USED IN SEMICONDUCTOR DEVICE MANUFACTURING EQUIPMENT

[75] Inventor: Shori Mokuo, Saga-ken, Japan

[73] Assignees: Tokyo Electron Limited, Tokyo; Tokyo Electron Kyushu Limited, Tosu, both of Japan

[21] Appl. No.: 246,266

[22] Filed: May 19, 1994

[30] Foreign Application Priority Data

May 19, 1993 [JP] Japan .................. 5-140027
May 19, 1993 [JP] Japan .................. 5-140028

[51] Int. Cl.$^6$ .................................................. H04L 27/00
[52] U.S. Cl. .................................. 375/259; 371/70
[58] Field of Search ................................. 375/259, 219, 375/260, 295, 298, 300, 302, 316; 371/70, 67.1, 69.1

[56] References Cited

U.S. PATENT DOCUMENTS 4,045,771  8/1977  Loreck ........................ 371/70
4,070,648  1/1978  Mergenthaler et al. ............ 371/70
4,860,286  8/1989  Forsberg et al. ................ 371/70
5,431,179  7/1995  Miyazaki et al. ................ 134/61

*Primary Examiner*—Stephen Chin
*Assistant Examiner*—Hai H. Phan
*Attorney, Agent, or Firm*—Oblon, Spivak, McClelland, Maier & Neustadt, P.C.

[57] ABSTRACT

A communication system used in a semiconductor device manufacturing equipment includes a master side transmission unit having a master transmitting logic module for transmitting information in an inverted two-successive transmission mode in which information having non-inverted information and inverted information of the non-inverted information as one pair is transmitted and a master receiving logic module, and a plurality of slave side transmission units respectively mounted on a plurality of process units of a cleaning apparatus of the semiconductor device manufacturing equipment and each having a slave transmitting logic module and a slave receiving logic module which receives the non-inverted information and inverted information, for fetching the information when the contents of the non-inverted information and inverted information coincide with each other.

6 Claims, 19 Drawing Sheets

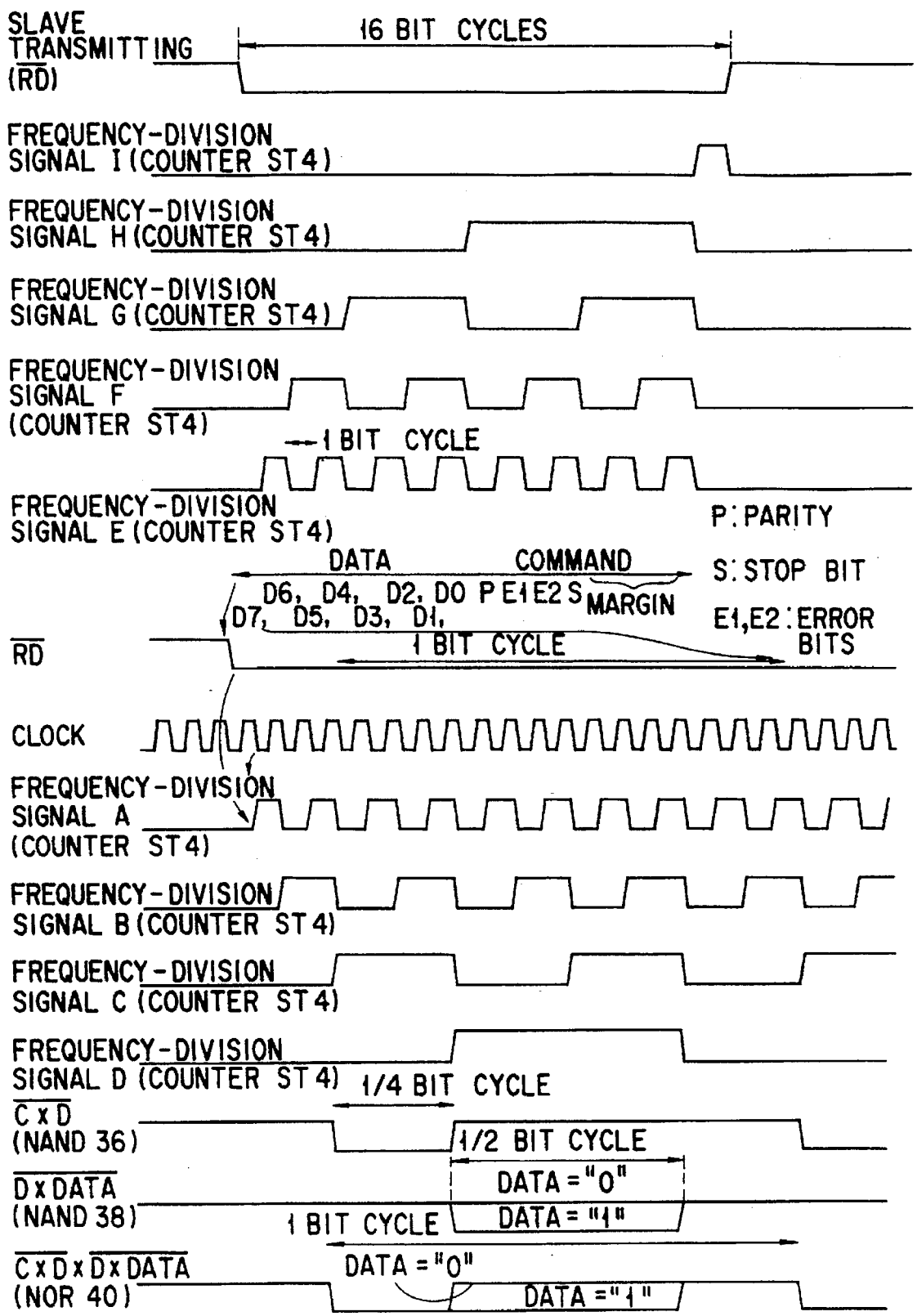
F I G. 13

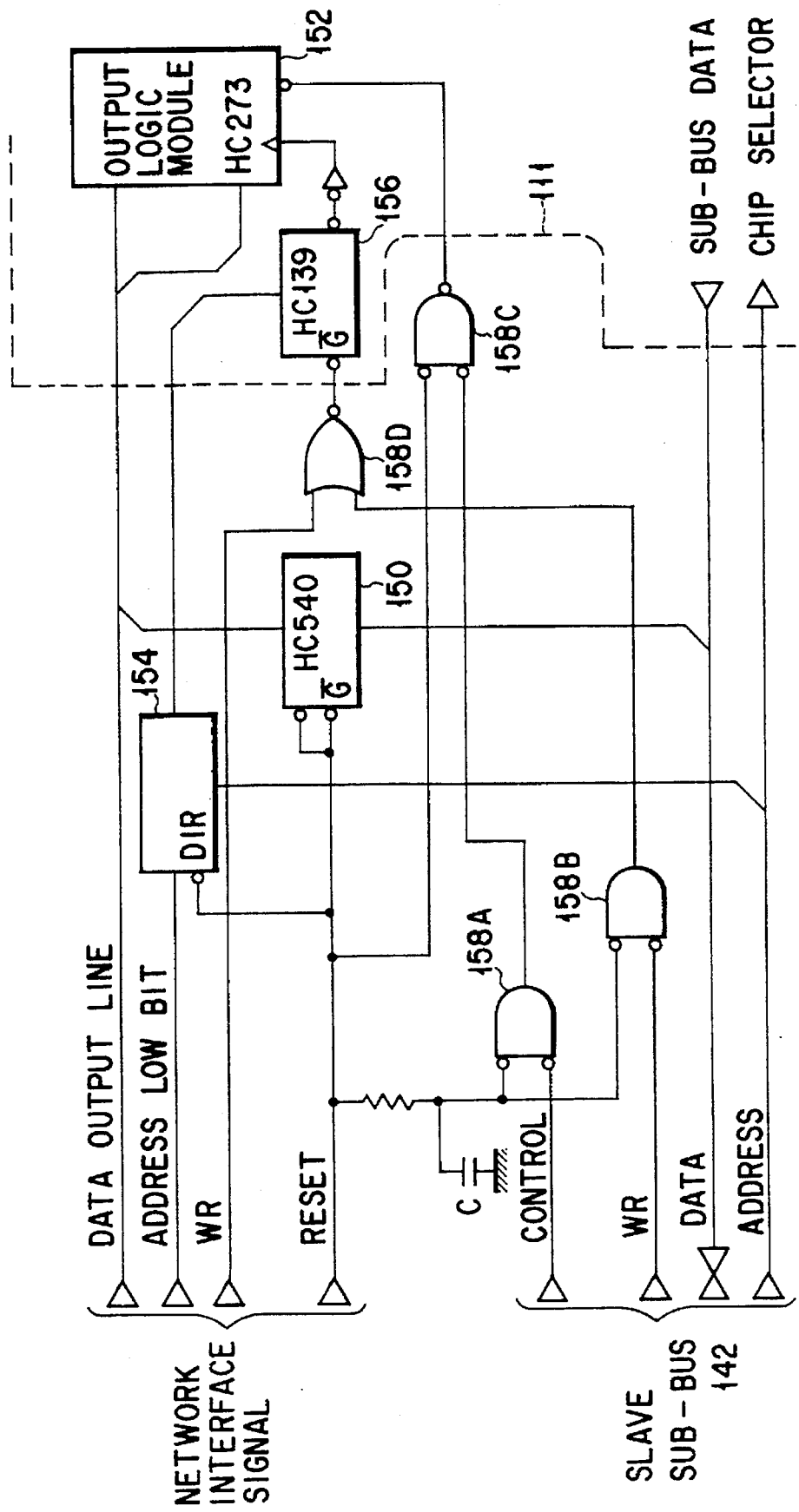
F I G. 16

COMMUNICATION SYSTEM USED IN SEMICONDUCTOR DEVICE MANUFACTURING EQUIPMENT

BACKGROUND OF THE INVENTION

1. Field of the Invention

This invention relates to a communication system used in a semiconductor device manufacturing equipment.

2. Description of the Related Art

Generally, in a control unit for a semiconductor device manufacturing equipment, outputs of sensors or the like are supplied to the host computer, and information or data is transferred via a network to drive relays and solenoids or the like according to received data. In this case, a to-be-controlled system generally includes a plurality of slave side transmission systems and the slave side transmission systems are directly or indirectly connected to a master side transmission system to attain an interface between the transmission systems and the host computer. For communication between the master side transmission system and the slave side transmission systems, control sections such as microcomputers are provided in the respective systems and data transmission is effected by use of general interface, for example, transmission system RS232C which is widely used for serial transmission, for example. In the transmission system RS232C or the like, data is always transmitted in the unit of a character and synchronizing information items are inserted before and after the character. That is, the start bit is inserted before the character as the synchronizing information item and the stop bit is inserted after the character as the synchronizing information item.

In the above transmission system, it is necessary to set the start bit for each character and therefore the transmission speed becomes low. For example, with the general transmission system RS232C described above, the transmission speed is 9600 baud or 9600 bits/sec. For example, when all the 256-byte I/O data which can be managed by an 8-bit address is transmitted, at least one to several seconds are required for transmission, thereby causing a problem because high-speed transmission cannot be attained. Further, in the above transmission system, for example, if noise is imposed on data in the data transmission and the data disappears, disappearance of the data cannot be recognized on the receiver side and errors tend to occur, thereby sometimes lowering the reliability.

Further, as described before, it is necessary to provide an expensive integrated circuit such as a microprocessor not only in the master side transmission system but also in the slave side transmission system and the cost tends to become high.

In general, various types of sensors and driver systems are incorporated in various types of to-be-controlled devices, for example, semiconductor device manufacturing equipment, and in some cases, the operator wants to monitor the operating conditions thereof, but in the above system, the main computer of the network always monitors the status thereof via the interface, and when a display unit capable of displaying the ON/OFF state thereof by use of light emitting elements such as LEDs is provided in the computer, the monitoring process can be attained by operating the main computer.

However, if the main computer does not include such a display unit, the operating condition cannot be monitored. In this case, it is considered to interrupt the slave bus line on the slave side and monitor the operating condition, but since the input/output of the data line is controlled by the main computer, access cannot be freely made from the slave side.

Further, even if the main computer includes the above display unit, the operating condition of the to-be-controlled device cannot be monitored from the main computer side at the time of debugging of the slave side itself before the network is connected or when the network itself is down, for example.

SUMMARY OF THE INVENTION

An object of this invention is to provide a communication system used in a semiconductor device manufacturing equipment, which can permit an expensive integrated circuit to be omitted from the slave side unit, prevent occurrence of errors due to noises and transmit data at high-speed.

According to this invention, there is provided a communication system comprising a master side transmission unit having a master transmitting logic module and a master receiving logic module; and a slave side transmission unit having a slave transmitting logic module and a slave receiving logic module; wherein information communication is effected between the master and slave side transmission units and at least one of the master side transmission unit and the slave side transmission unit transmits information in an inverted two-successive transmission mode in which non-inverted information and inverted information of the non-inverted information are transmitted as a pair.

According to this invention, there is provided a communication system comprising a master side transmission unit having a master transmitting logic module and a master receiving logic module and a slave side transmission unit having a slave transmitting logic module and a slave receiving logic module, whereby information communication is effected between the master and slave side transmission units, and wherein the master and slave side transmitting logic modules latch data at substantially the middle portion of one bit cycle for each bit cycle of information to be transmitted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a waveform diagram of signals in the slave transmitting logic module;

FIG. 16 is a block construction diagram of a sub-operation unit shown in FIG. 15;

DETAILED DESCRIPTION OF THE PREFERRED EMBODIMENTS

Figure 1:
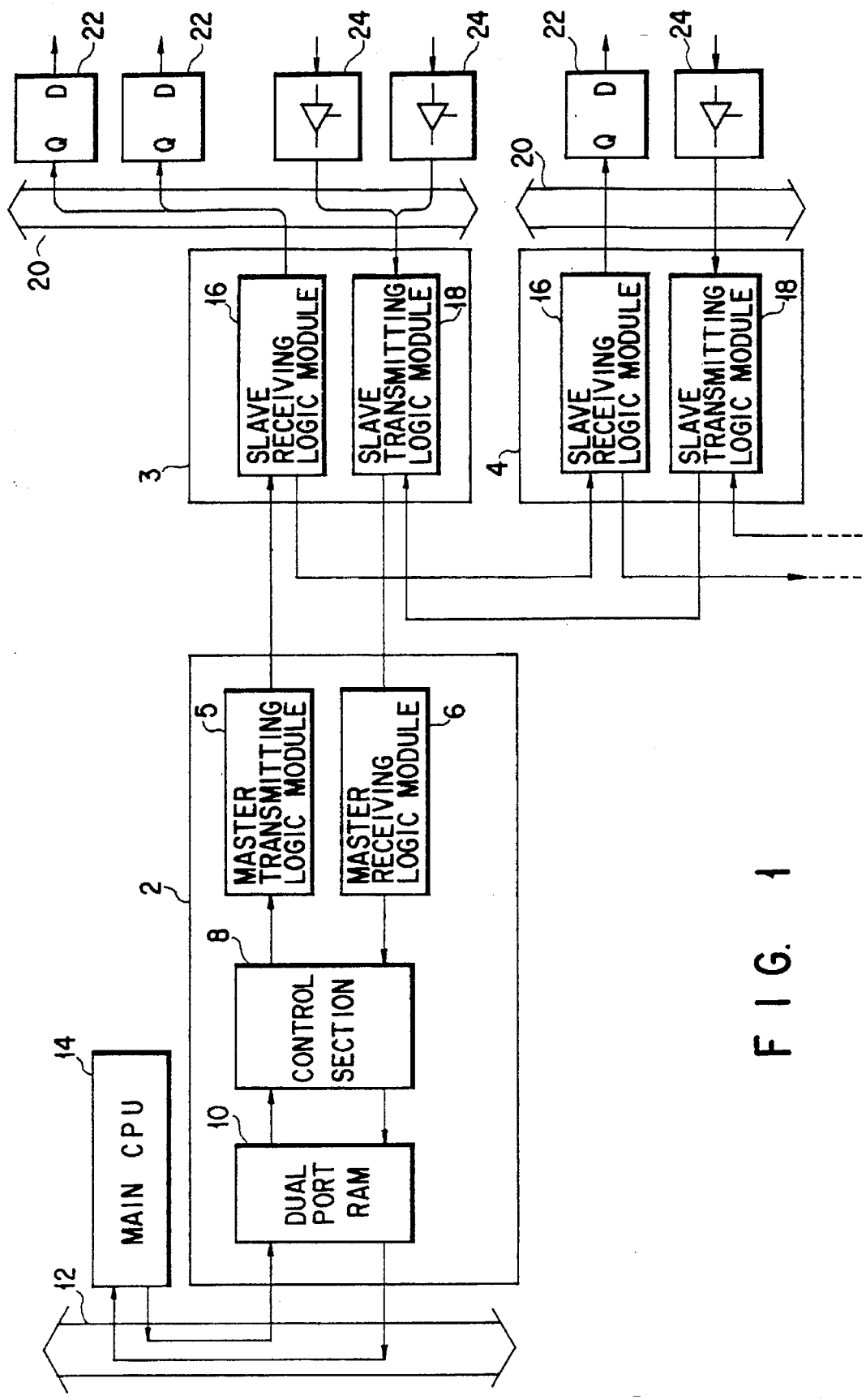
FIG. 1 is a schematic construction diagram of a serial bus communication system according to one embodiment of this invention used in a semiconductor device manufacturing equipment.
Figure 2:
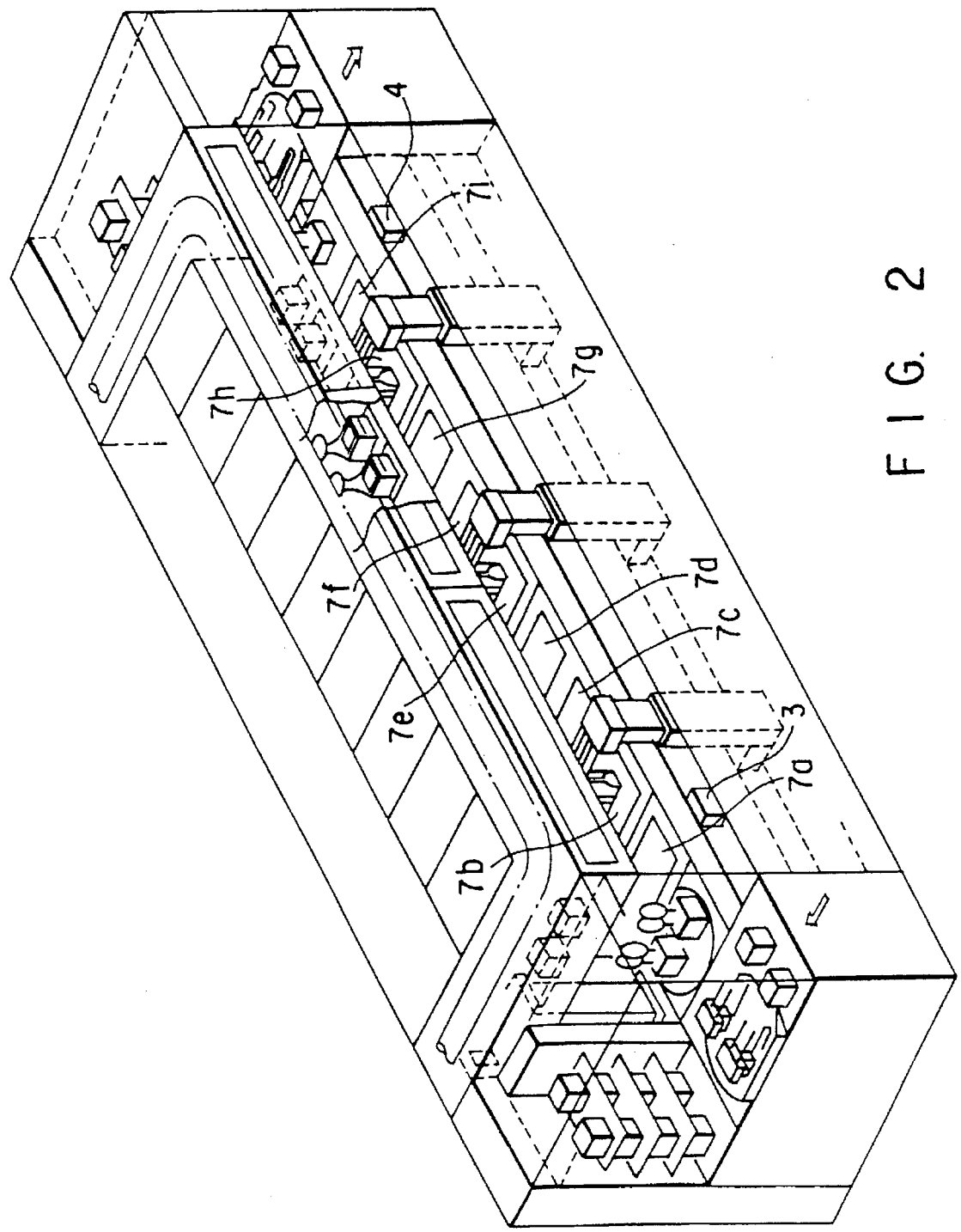
FIG. 2 is a perspective view of a cleaning apparatus of the semiconductor device manufacturing equipment to which the communication system of FIG. 1 is applied.

According to a communication system of the semiconductor device manufacturing equipment shown in FIG. 1, a master side transmission unit 2 and one or a plurality of slave side transmission units 3 and 4 disposed in position apart from the master side transmission unit are provided to communicate with the master side transmission unit 2 For example, as shown in FIG. 2, the slave side transmission units 3 and 4 are attached to a cleaning section of the semiconductor device manufacturing equipment having a chuck cleaning sections 7a, first chemical washing section 7b, water washing sections 7c, 7d, second chemical washing sections 7e, water washing sections 7f, 7g, chuck cleaning section 7h and drying section 7i. The cleaning apparatus shown in FIG. 2 is explained in detail in U.S. patent application Ser. No. 08/197,285 and the explanation therefor is omitted.

The master side transmission unit 2 includes a master transmitting logic module 5, a master receiving logic module 6, a control section 8 including a microprocessor (CPU), peripheral circuits (ROM, RAM) and the like, for example, to control the logic modules 5 and 6, and a bidirectional memory or dual port RAM 10 which is connected to the main CPU 14 via a main bus 12 such as a VME bus. Each of the slave side transmission units 3 and 4 includes a slave receiving logic module 16 and a slave transmitting logic module 18, the slave receiving logic modules 16 are connected in a chain form or a multidrop form and the slave transmitting logic modules 18 are connected in a chain form or a multidrop form, and one of the slave receiving logic modules 16 and a corresponding one of the slave transmitting logic modules 18 are respectively connected to the master transmitting logic module 5 and the master receiving logic module 6 of the master side transmission unit 2.

Each of the slave receiving logic modules 16 and a corresponding one of the slave transmitting logic modules 18 are respectively connected to an output port or ports 22 constructed by a latch, for example, and an input port or ports 24 constructed by a tri-state buffer, for example, via a slave side bus 20. In this case, the slave buses 20 are independently provided for the respective different slave side transmission units 3 and 4.

Further, each of the slave receiving logic modules 16 and a corresponding one of the slave transmitting logic modules 18 are connected to the slave side bus 20 via an 8-bit data input line and data output line, respectively, thereby making it possible to output data with respect to a network, for example, a master side transmission unit 2 and receive other data. For example, the main CPU 14 writes output data into the dual port RAM 10 via the main bus 12 and the control section 8 reads out the output data from the dual port RAM 10 and transfers the same to the master transmitting logic module 5. The master transmitting logic module 5 subjects the output data to the inverted two-successive transfer process according to protocol. That is, the master transmitting logic module 5 successively transfers a set of non-inverted address and inverted address and a set of non-inverted data and inverted data to the slave side transmission unit 3.

The slave receiving logic module 16 of the slave side transmission unit 3 latches the address from the master side and checks whether the address subjected to the inverted two-successive transfer process coincides with its own head address or not. If the two addresses coincide with each other, the slave side transmission unit 3 latches output data from the master side transmission unit 2 while transmitting input data from the slave transmitting logic module 18 to the master side.

When the master receiving logic module 6 completes reception of data from the slave side transmission unit 3, command data of the master receiving logic module 6 is set to a preset value. The control section 8 responds to the command data value to effect the data processing such as bit inversion if required and then transmits input data to the dual port RAM 10. The main CPU 14 receives PIO data as input data via the dual port RAM 10. In this case, serial communication between the master and slave side transmission units 2 and 3 is effected according to the transmission protocol shown in FIG. 3A and one bit cycle set in this case is constructed as shown in FIG. 3B.

Figure 3A:
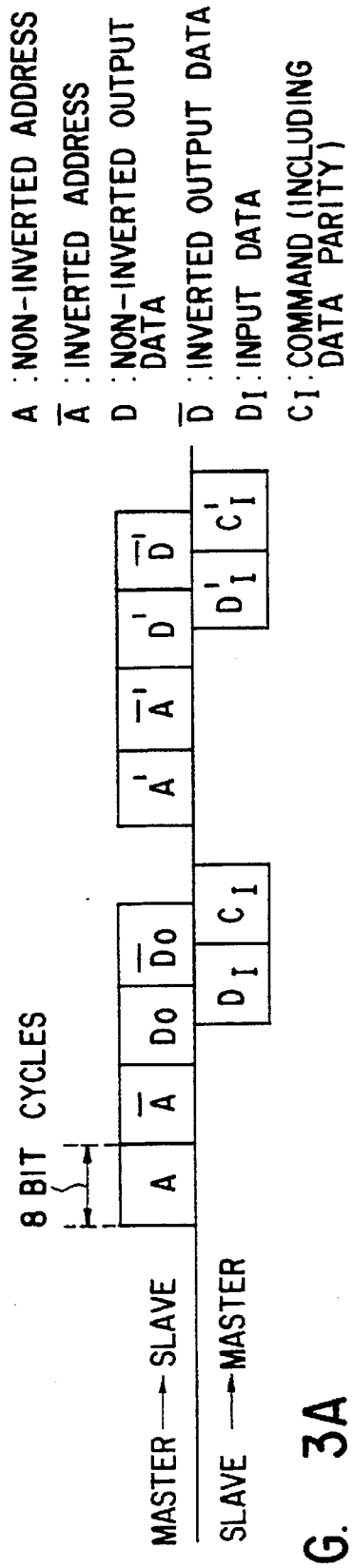
FIGS. 3A and 3B are diagrams showing the data transfer by the serial bus communication system of this invention and the bit configuration.
Figure 3B:
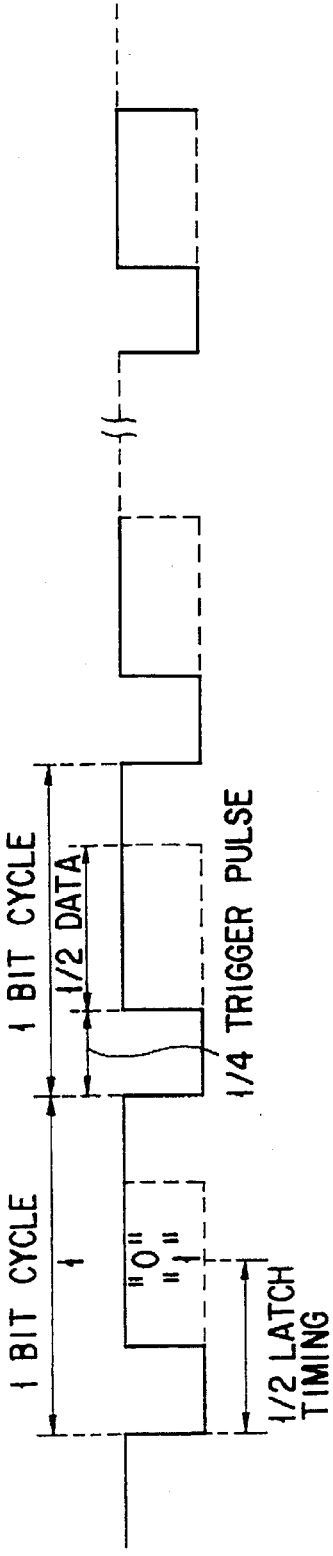

In this communication, on the transmission side, a trigger pulse with a width of approx. ¼ of one bit cycle is output for each bit cycle of data transmitted as shown in FIG. 3B and then data (for example, H="0" and L="1") of length which is equal to approx. ½ of one bit cycle is output after the pulse. In contrast, on the reception side, the latching operation is effected when a preset period of time, for example, preset length of time corresponding to approx. ½ of one bit cycle has elapsed after the leading edge of the trigger pulse so as to latch data in each bit cycle.

In the above-described system, if the master side transmission unit 2 successively transmits data of a preset length, for example, two byte data, and the slave side transmission unit 3 sequentially latches successively transmitted data, collates data (for example, by parity check) at a specified timing, for example, when reception of data of two bytes (16 bits) is completed, then holds the data and clears the counter if the reception is interrupted for a preset period of time, for example, 2 bit cycles after completion of data transfer, and then makes ready for the next transfer operation with this system, the slave side transmission units 3 and 4 can be constructed only by use of logic circuits.

As shown in FIG. 3A, transmission data is constructed by a non-inverted address A, inverted address $\overline{A}$, non-inverted output data D and inverted output data $\overline{D}$. The slave side transmission unit 3 compares the non-inverted address and inverted address with the self address belonging to itself, immediately feeds back input data $D_I$ and command $C_I$ on the slave side to the master side transmission unit 2 when the compared addresses coincide with each other, and latches output data when the non-inverted output data and inverted output data coincide with each other. The master side transmission unit 2 waits for arrival of the feedback input data and command, receives them and then immediately starts the next transmission/reception cycle. As a result, the parallel input/output port can be accessed with minimum time lag and high reliability. Input/output data is fetched by the master host CPU, that is, main CPU 14 via the dual port RAM 10 (FIG. 1). Therefore, the main CPU 14 and the CPU of the master side transmission unit 2, that is, control section 8 can be independently operated. In this case, if the dual port RAM 10 is not provided, it is necessary to temporarily stop the process of the master CPU 8 by an interrupt and effect the data input/output with respect to the main CPU 14 when the main CPU 14 issues a data input/output request to the master side CPU 8, thus causing time loss for both of the CPUs.

Next, the construction of each transmission/receiving logic module which is the feature of this invention to effect the above-described operation is explained with reference to FIGS. 4 to 7 and the operation thereof is explained with reference to the waveform diagrams of FIGS. 8 to 14.

Figure 4:
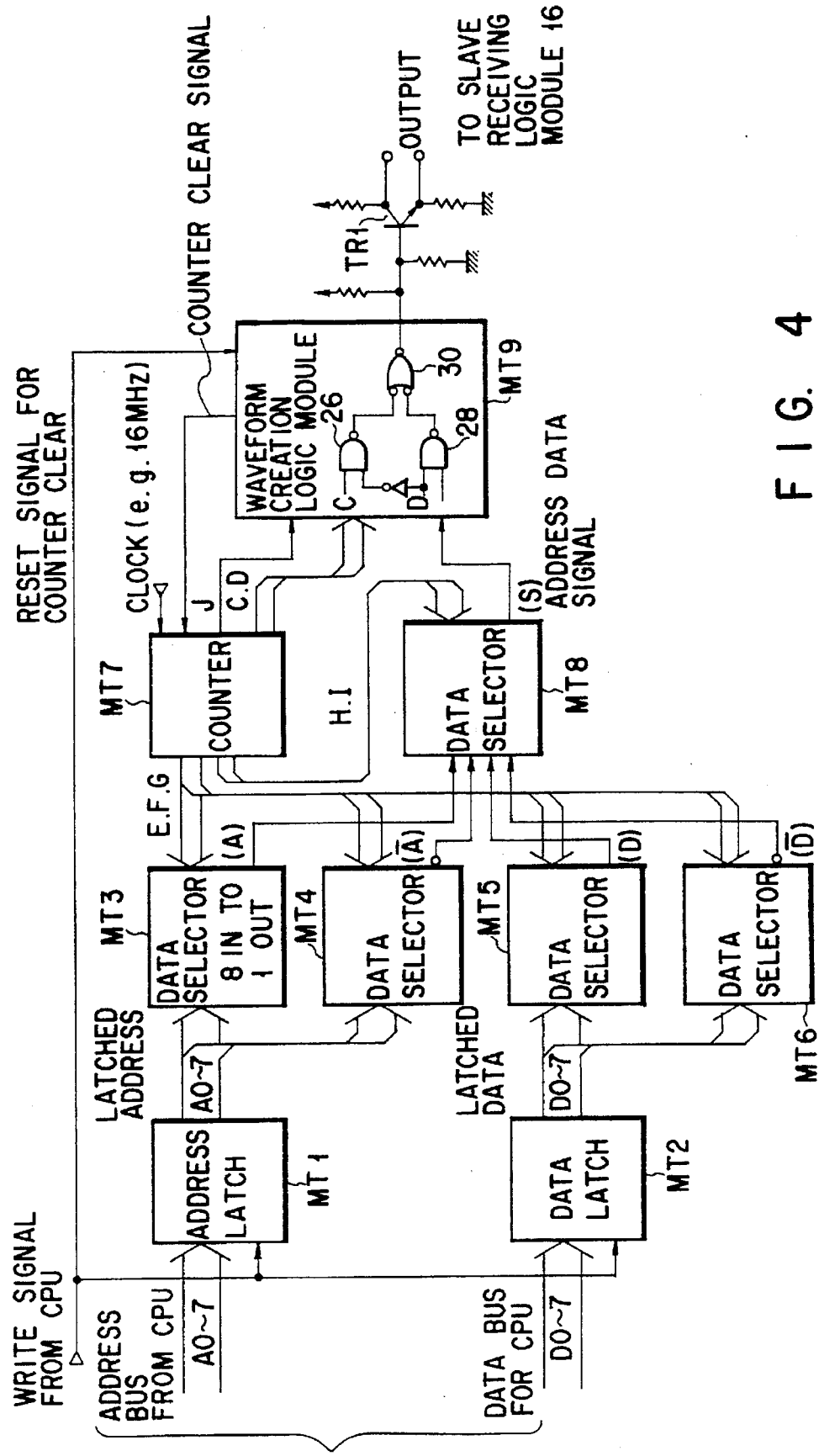
FIG. 4 is a construction diagram of a master transmitting logic module shown in FIG. 1.

With the master transmitting logic module 5 shown in FIG. 4, an address latch MT1 latches (temporarily stores) addresses A0 to A7 from the CPU of the control section 8 in response to a write signal and the output of the latch is kept held until the next write operation is effected. A data latch MT2 latches data from the CPU in response to a write signal and the output of the latch is kept held until the next write operation is effected. Data selectors MT3 to MT6 and MT8 each select one bit from an 8-bit or 4-bit input signal according to a 3-bit or 2-bit selection signal (8IN.TO.1OUT or 4IN.TO.1OUT) and output the same. Since the output can be expressed by positive or negative logic values, signals output from the selectors MT4 and MT6 can take the inverted logic form with respect to respective signals output from the selectors MT3 and MT5 if the selectors MT3, MT5 and MT8 are designed to operate on the positive logic and the selectors MT4 and MT6 are designed to operate on the negative logic, thereby making it possible to easily construct transmission data for the inverted two-successive transmission/collation in the serial communication. The selectors MT3 to MT6 and MT8 may be constructed by shift registers. The selectors are operated as a selector for 32 bits as a whole.

The counter MT7 sequentially divides the frequency of a clock input of 16 MHz, for example, by two and outputs the count as one of binary coded frequency-division signals A to J. The count-up operation is interrupted by input of a counter clear signal and all of the outputs are reset (set to the initial condition). A waveform creation logic module MT9 creates an output waveform according to frequency-division signals C, D and J from the counter MT7 and an address/data signal of the data selector MT8 and sets or resets the counter clear signal. Further, the waveform creation logic module MT9 outputs a counter clear signal in response to a write signal from the CPU to reset the counter MT7. The logic module MT9 includes two NOR circuits 26 and 28 and NAND circuit 30, for example, and in this embodiment, it is assumed to use a programmable logic array, but a logic IC can be used. An output of the logic module MT9 is supplied to the slave receiving logic module by turning ON/OFF a transistor TR1 to which a bias resistor and a termination resistor are connected. As a transmission path, twisted pair lines (not shown) may be used.

The transmitting logic module 5 thus constructed latches an address and data from the CPU in response to a write signal, and at the same time, starts the operation of the counter MT7 to sequentially select the address, non-inverted addresses A7 to A0, inverted addresses $\overline{A7}$ to $\overline{A0}$, non-inverted data items D7 to D0, inverted data items $\overline{D7}$ to $\overline{D0}$ bit by bit and combine them with the frequency-division signal to create a transmission waveform, that is, effects the inverted two-successive transfer. When the entire transmission is completed, the counter clear signal is reset and a sequence of operations is terminated.

In FIG. 4, (A) indicates an address signal selected by the frequency-division signals E, F and G in the data selector MT3, ($\overline{A}$) an inverted signal of the address selected by the frequency-division signals E, F and G in the data selector MT4, (D) a data signal selected by the frequency-division signals E, F and G in the data selector MT5, ($\overline{D}$) an inverted signal of the data signal selected by the frequency-division signals E, F and G in the data selector MT6, and (S) an address or a data signal selected by the frequency-division signals H and I in the data selector MT8.

Next, the slave receiving logic module 16 is explained with reference to FIG. 5. Inverted data $\overline{DATA}$ is input to the input section of the logic module 16 via a photocoupler 32, for example. To the input section, a transistor TR2 for outputting the same data to the next stage slave receiving logic module 16 is connected. When $\overline{DATA}$ is input to a clear logic module SR3, a counter SR1 clear signal is reset. As a result, the counter SR1 outputs the frequency-division signals B, C and D of the clock. The clear logic module SR3 outputs a latch signal, count-up signal and counter SR1 clear signal in response to the frequency-division signals B, C and D from the counter SR1. The counter SR4 outputs a frequency-division signal (count signal) to a selector SR5 and output selection latches SR6 to SR9 in response to the count-up signal. The counter SR4 is used as a bit number counter for input data. The selector SR5 outputs a latch signal to one of the latches SR6 to SR9 according to the frequency-division signals D and E from the counter SR4 and a clear signal from the clear logic module SR3. In the drawing, a reference symbol CS denotes a chip selector.

The output selection latches SR6 to SR9 latch input address/data into bits specified by the frequency-division signals A, B and C from the counter SR4 in response to a latch signal from the selector SR5. The counter SR2 starts to count the clock when input of $\overline{DATA}$ is interrupted and the frequency-division signal of the counter SR1 has reached a preset value to set the counter SR1 clear signal (an inverted signal of the counter SR2 clear signal). When a frequency-division signal E is output from the counter SR2 (a period of two bit cycles has elapsed), a signal CLR and data clear signal $\overline{CR}$ are supplied to the counter SR4 and the succeeding-stage latch 22 to clear the counter SR4 and the succeeding-stage latch 22.

A comparator SR10 is provided to check whether or not addresses latched in the two output selection latches SR6 and SR7 are equal to each other, and if an abnormal communication condition occurs, any one of the bits of the output selection latches SR6 and SR7 takes a different value and an address coincidence signal is not output. A comparator SR11 checks whether data items latched in the other two output selection latches SR8 and SR9 are equal to each other or not and outputs an output only when the $\overline{\text{EN}}$ terminal is active (low). When an abnormal communication condition occurs, any one of the bits of the output selection latches SR8 and SR9 takes a different value and a data coincidence signal is not output. A comparator SR12 checks whether the content specified by an address setting switch 34 and an address transmitted are coincident with each other or not. When a plurality of slave side transmission units are provided, addresses for them are independently provided and the communication is effected in one-to-one correspondence to the master side transmission unit 2. When the address coincidence signal is input to the $\overline{\text{EN}}$ terminal and P=Q, the comparator SR12 outputs a board select signal. The circuits SR6 to SR10 can be constructed by shift registers.

The slave transmitting logic module 18 is explained with reference to FIG. 6.

Data selectors ST1 and ST3 select and output one of 8-bit input signals according to the frequency-division signals E, F and G of a counter ST4. In the selector ST1, input data is selected, and in the selector ST3, a parity created by a parity creation unit ST2, an error bit for informing the abnormal condition of the slave side and a termination code are selected. The parity creation unit ST2 outputs a parity of data (indicating that the total sum of the data bits is even or odd). A counter ST4 is released from the clear state by the slave transmission signal from the slave receiving logic module and outputs frequency-division signals A to I. The counter ST4 cancels the clock input when outputting the frequency-division signal I (at the termination of 16 bit cycles) and inhibits further data output. A data selector ST5 outputs data of the input/output data bus when the frequency-division signal H is low and outputs command data when it is high. A waveform creation logic module ST6 creates an output waveform based on the frequency-division signals C and D of the counter ST4 and the data/command signal. The logic module ST6 includes two NAND circuits 36 and 38 and two NOR circuits 40 and 42, for example, and an output thereof is output to the master receiving logic module 6 by turning ON/OFF the transistor TR3 to which the bias resistor and termination resistor are connected. Further, a photocoupler 44 for interrupting a signal from the other slave side transmission system is connected to one of the NOR circuits or the NOR circuit 42.

The master receiving logic module 6 is explained with reference to FIG. 6.

For example, an inverted $\overline{\text{DATA}}$ is input to the logic module 6 via a photocoupler 46. A counter MR1 outputs frequency-division signals B, C and D of the clock when the inverted $\overline{\text{DATA}}$ is input to a clear logic module MR2 and a counter MR1 clear signal is reset. The clear logic module MR2 outputs inverted latch signals $\overline{\text{G1}}$ and $\overline{\text{G2}}$, count-up signal, counter MR1 clear signal in response to frequency-divided outputs of the counter MR1 and a frequency-division signal D of the counter MR3. The counter MR1 clear signal is held until a next inverted $\overline{\text{DATA}}$ is input. The counter MR3 outputs a count number (frequency division) counted from the time when data is started to be loaded down to the slave side transmission unit from the master side transmission unit by a count-up signal to output selection latches MR4 and MR6 and clear logic module MR2. The output selection latch MR4 latches input data into bits specified by the frequency-division signals A, B and C from the counter MR3 at a timing defined by the latch signal $\overline{\text{G1}}$ from the clear logic module MR2. The output selection latch MR6 latches input data into bits specified by the frequency-division signals A, B and C from the counter MR3 at a timing defined by the latch signal $\overline{\text{G2}}$ from the clear logic module MR2. The output selection logic module MR5 subjects data from the output selection latch MR4 and the parity in the command to the sum checking process and outputs the parity to a 3-state buffer MR8. The resultant parity is always constant if data is correct. A 3-state buffer MR7 is provided to fetch data received by the CPU into its own register belonging to itself and the 3-state buffer MR8 is provided to fetch data received by the CPU into its own register.

Next, the operation of the logic module is explained in detail with reference to the waveform diagram.

Figure 5:
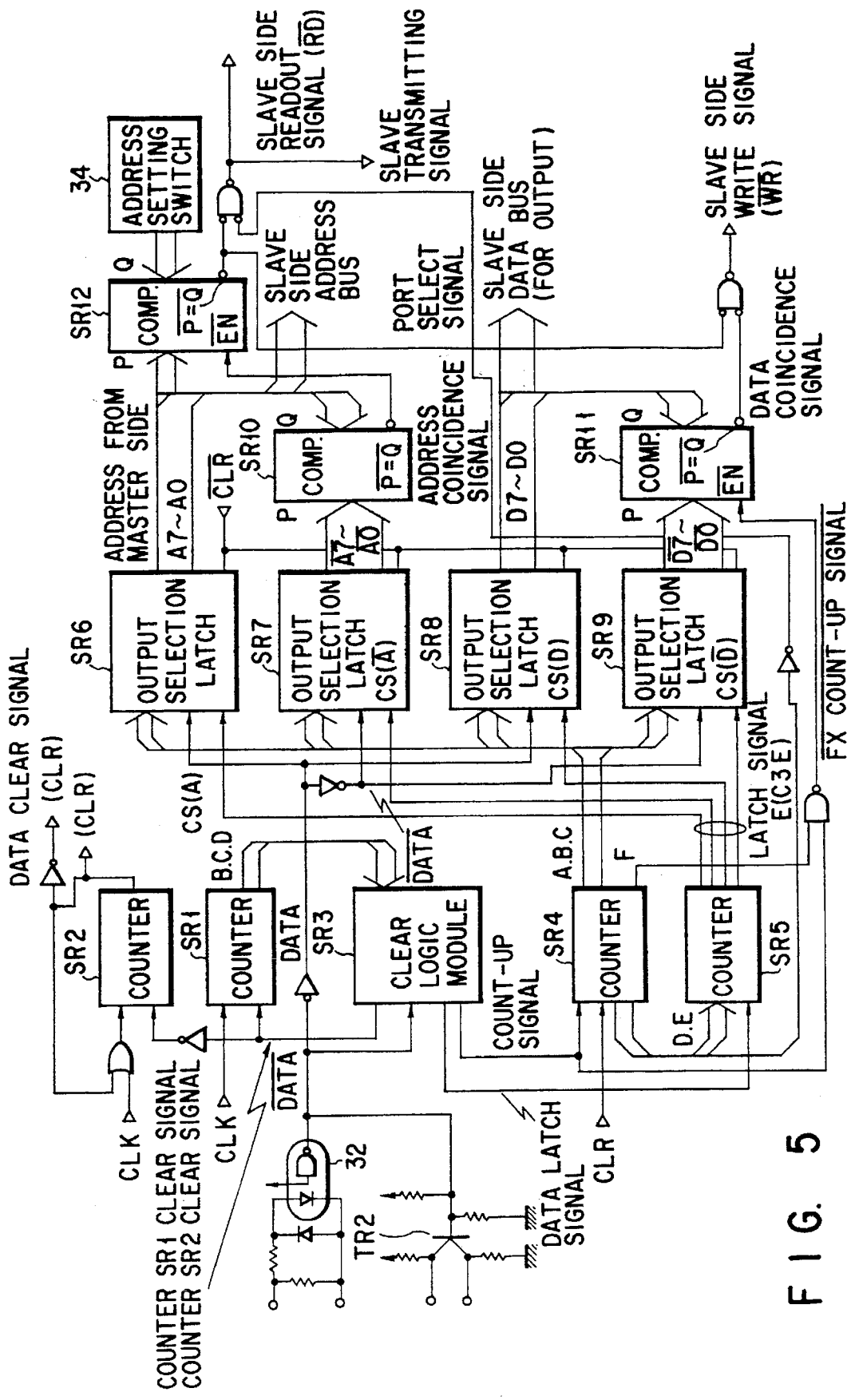
FIG. 5 is a construction diagram of a slave receiving logic module shown in FIG. 1.
Figure 6:
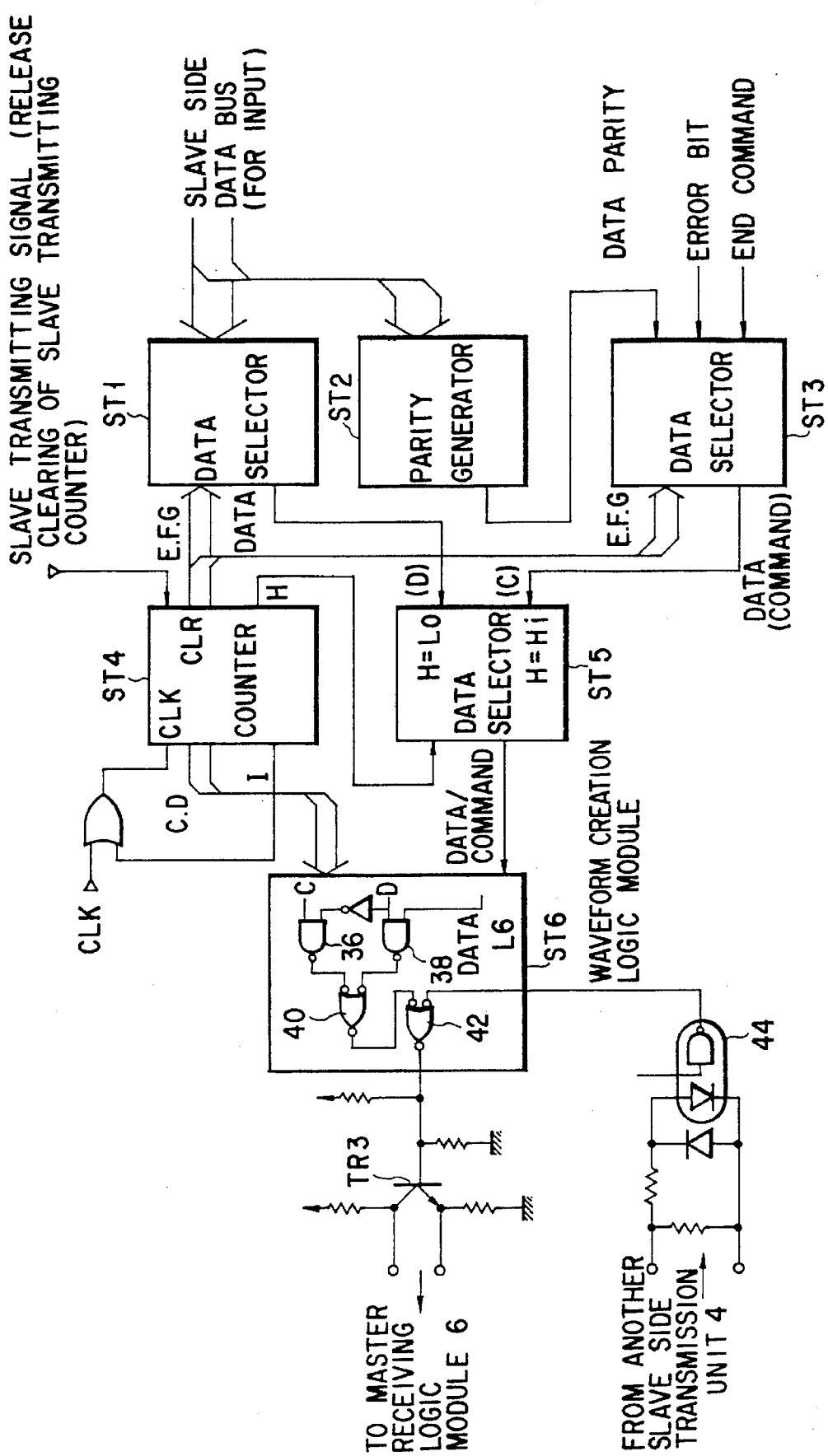
FIG. 6 is a construction diagram of a slave transmitting logic module shown in FIG. 1.
Figure 7:
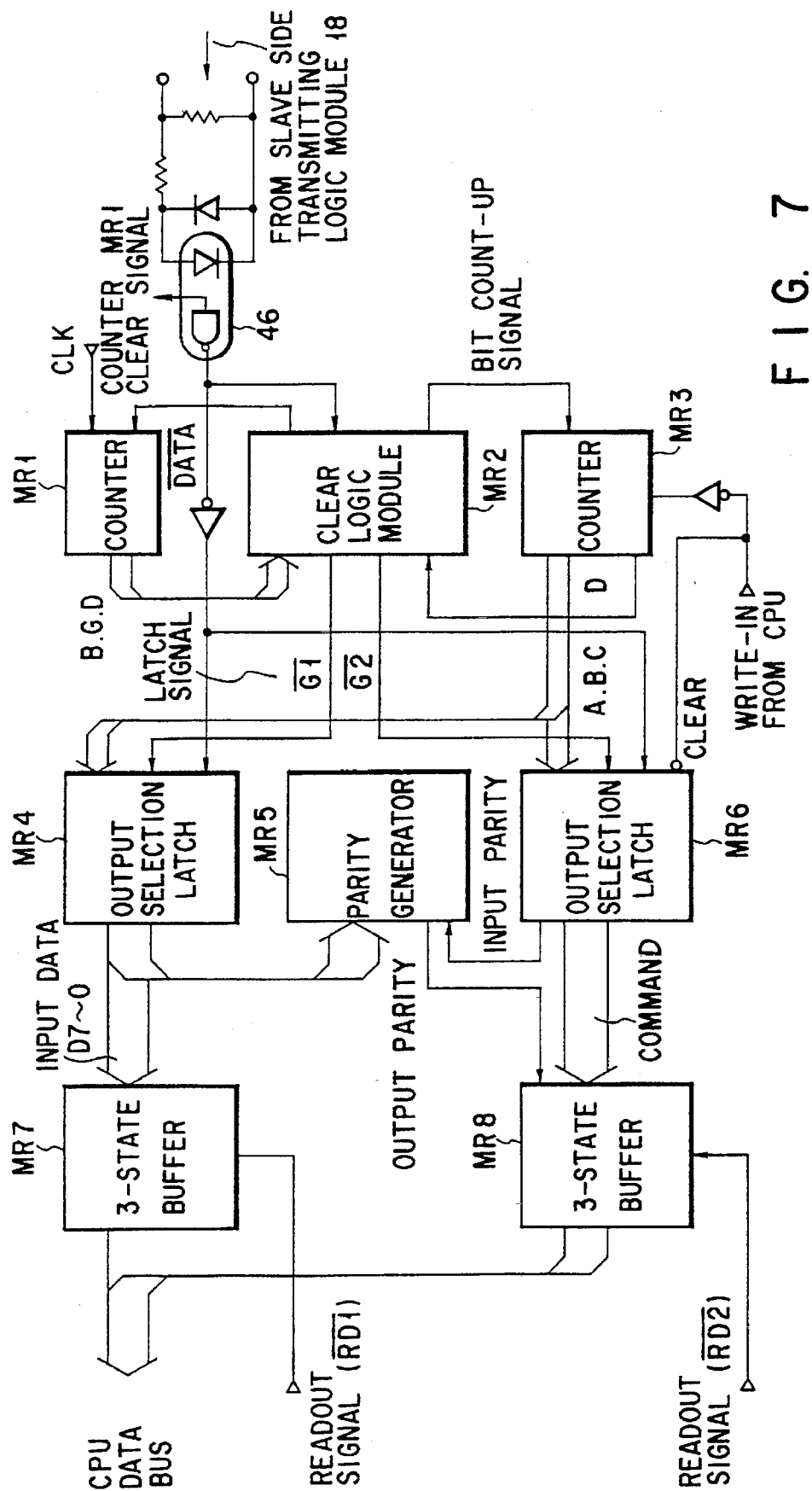
FIG. 7 is a construction diagram of a master receiving logic module shown in FIG. 1.
Figure 8:
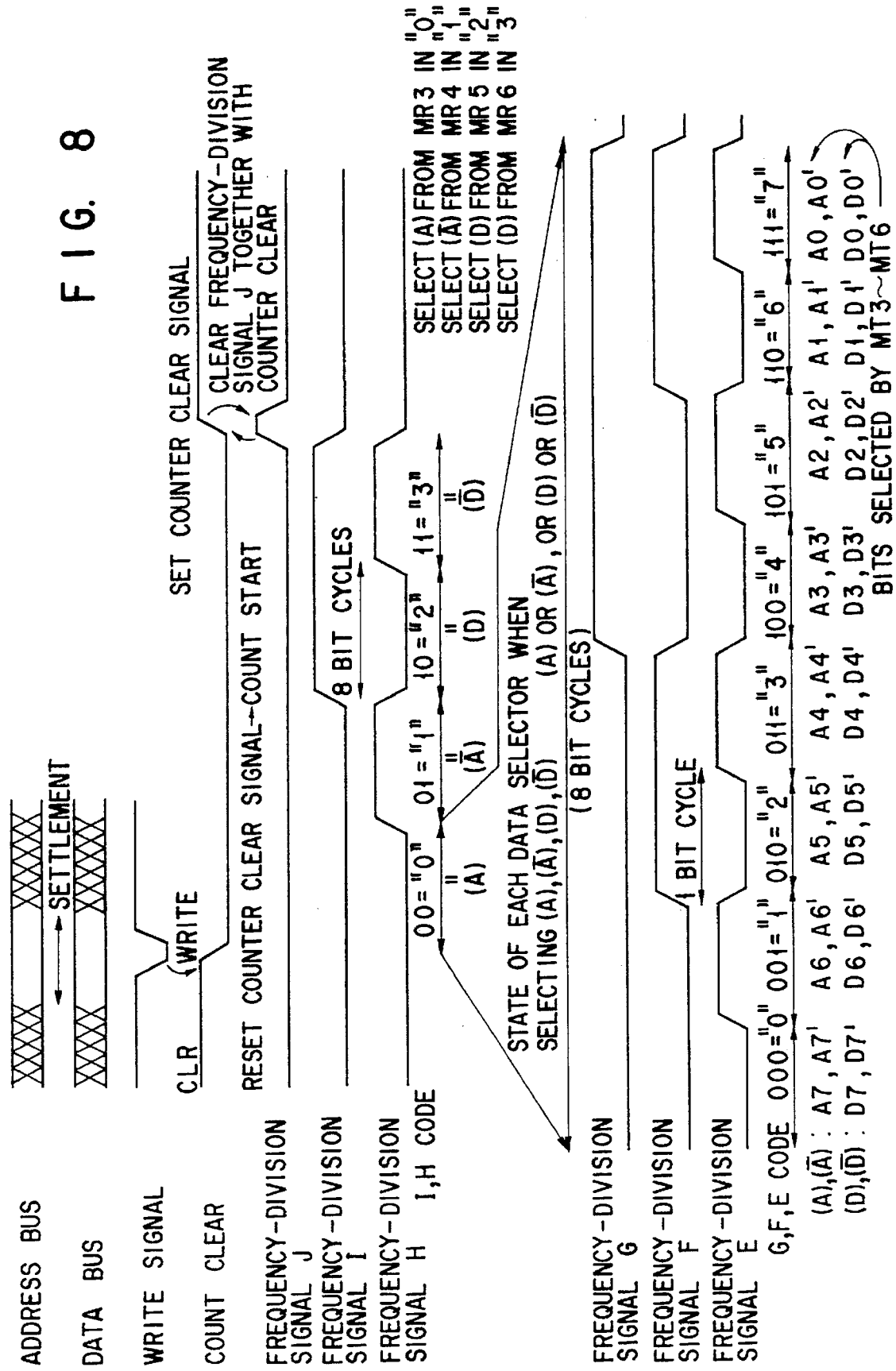
FIG. 8 is a waveform diagram of signals in the master transmitting logic module.
Figure 9:
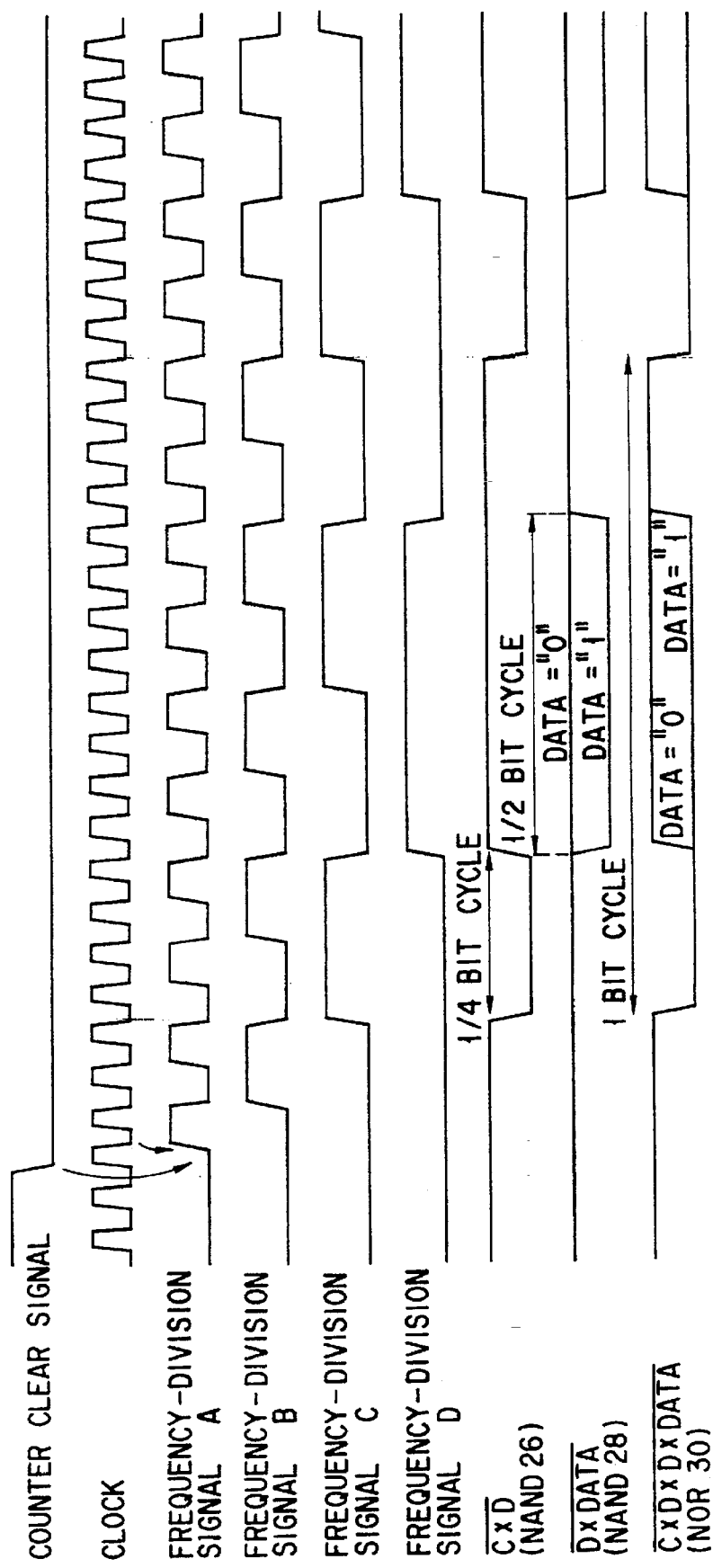
FIG. 9 is a waveform diagram of signals in the master transmitting logic module.
Figure 10:
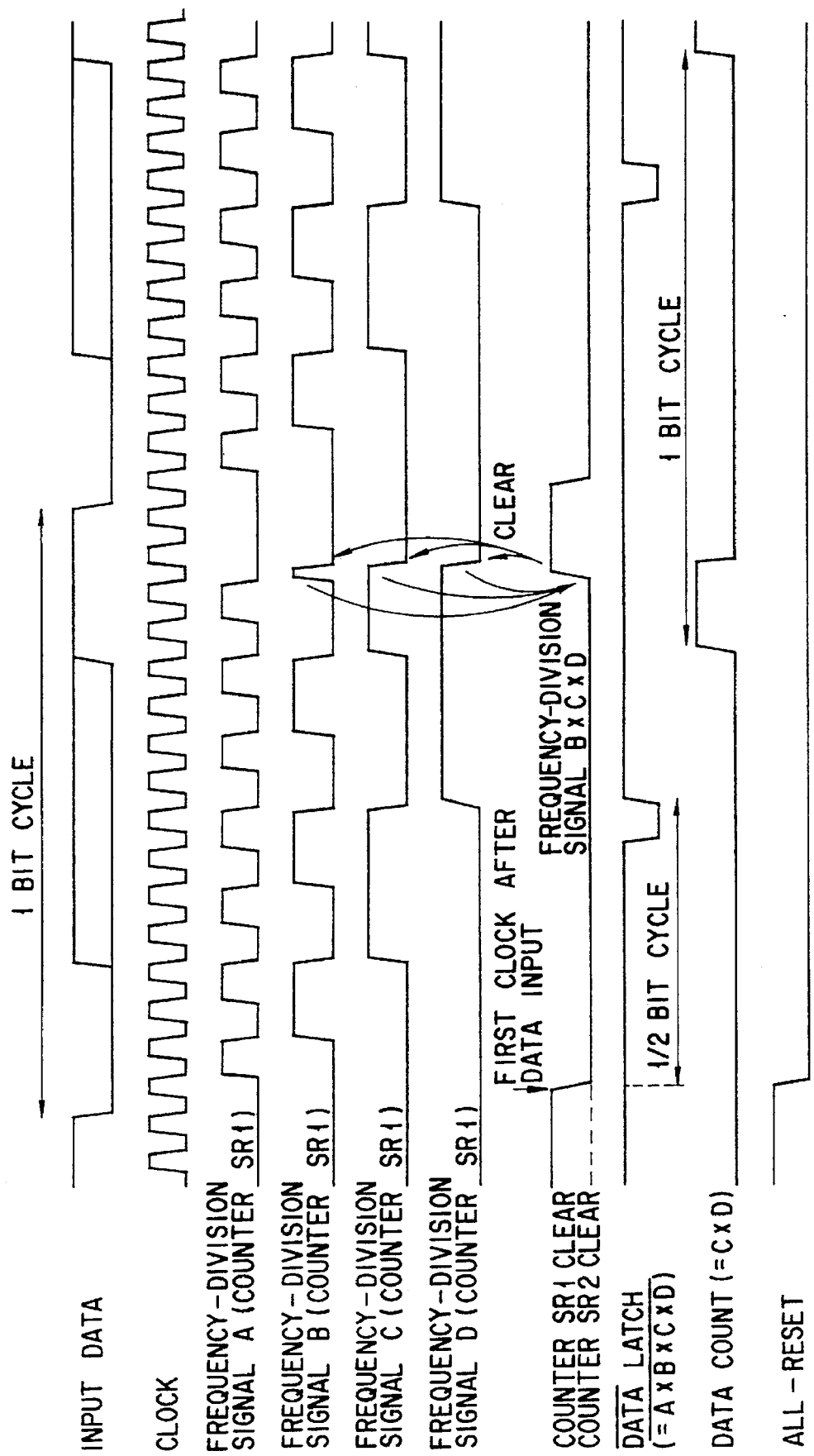
FIG. 10 is a waveform diagram of signals in the slave receiving logic module.
Figure 11:
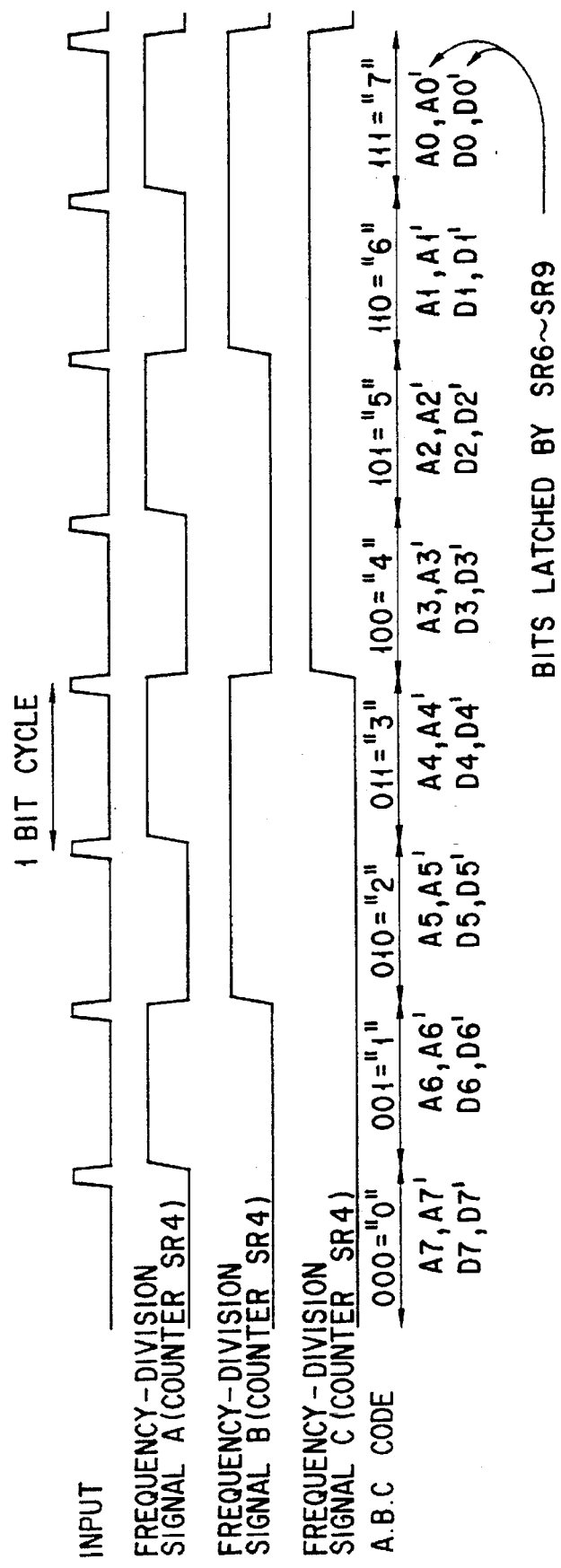
FIG. 11 is a waveform diagram of signals in the slave receiving logic module.
Figure 12:
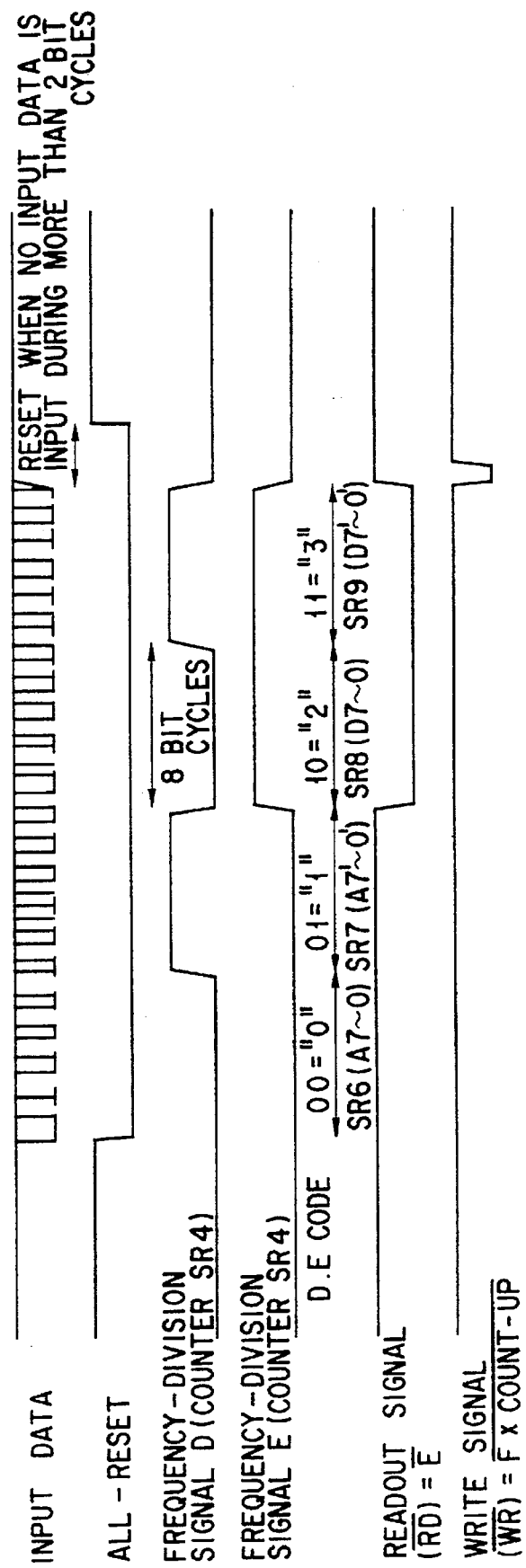
FIG. 12 is a waveform diagram of signals in the slave receiving logic module.
Figure 14:
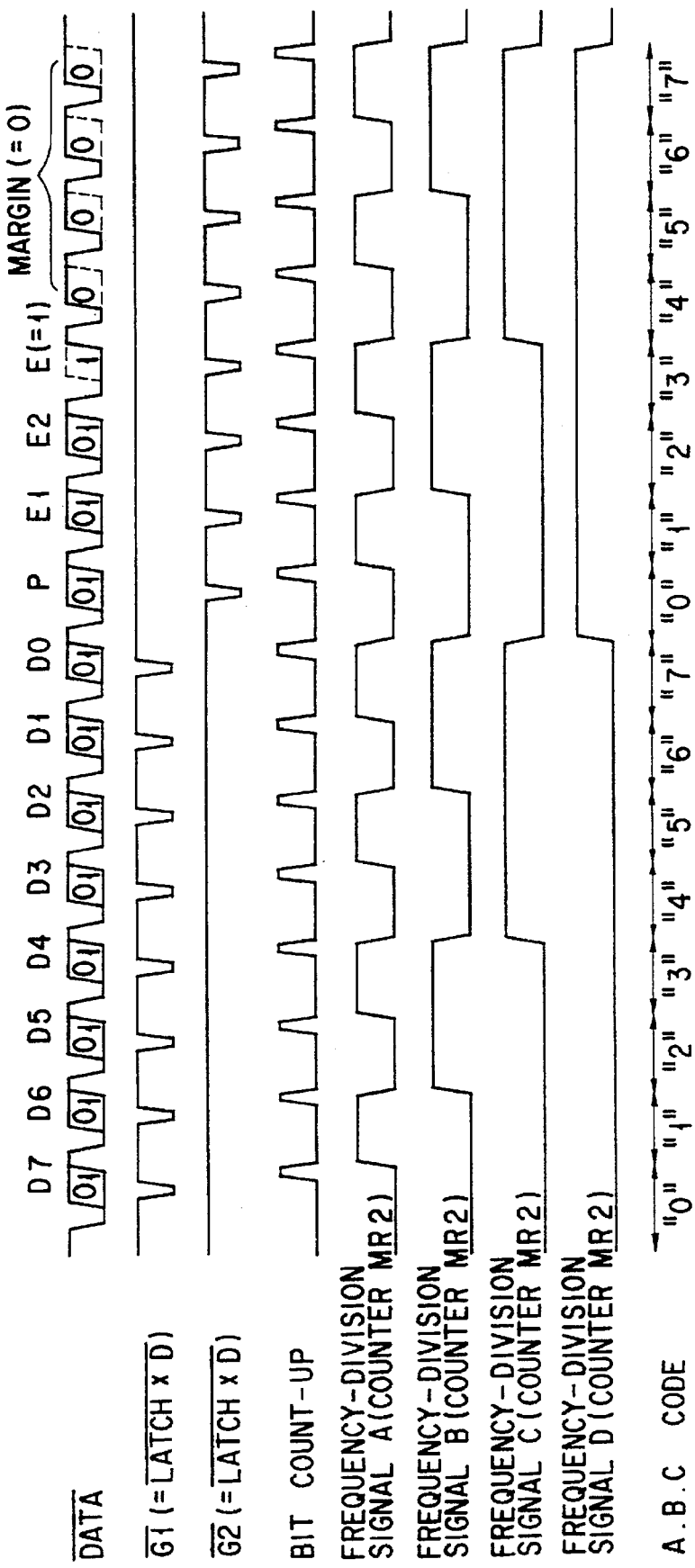
FIG. 14 is a waveform diagram of signals in the master receiving logic module.

FIGS. 8 and 9 are waveform diagrams in the master transmitting logic module 5 shown in FIG. 4, FIGS. 10 and 12 are waveform diagrams in the slave receiving logic module 16 shown in FIG. 5, FIG. 13 is a waveform diagram in the slave transmitting logic module 18 shown in FIG. 6, and FIG. 14 is a waveform diagram in the master receiving logic module 6 shown in FIG. 7.

First, referring to FIGS. 4, 8 and 9, the states of the address bus and data bus are determined as shown in FIG. 8 and a pulse of write signal is generated during the state determination as shown in FIG. 7. In response to the pulse, the counter clear signal is reset and the counter MT7 starts counting. By the start of the counting operation of the counter MT7, frequency-division signals A to J derived by sequentially dividing the frequency by two are output from the counter MT7 as shown in FIGS. 8 and 9.

The address and data from the CPU are respectively latched into the address latches MT1 and MT2 by the pulse of write signal and held in the latches until the next write operation is effected. The data selectors MT3 to MT6 select one input signal from the 8-bit input signals according to a 3-bit selection signal, that is, frequency-division signals E, F and G. The data selector MT8 selects one input signal from the 4-bit input signals according to 2-bit selection signals H and I. Selection of the data selector MT8 by the combination of frequency-division signals I and H is expressed by I and H codes in FIG. 8 and selection of the data selectors MT3 to MT6 by the combination of frequency-division signals G, E and F is expressed by G, E and F codes in FIG. 8. Further, 1 bit cycle in the drawing corresponds to 1 bit cycle in FIG. 3B.

In this case, if the selectors MT3, MT5 and MT8 are based on the positive logic and the selectors MT4, MT6 are based on the negative logic, outputs of the selectors MT4 and MT6 take an inverted logic form with respect to outputs of the selectors MT3 and MT5, thus constructing transmission data for inverted two-successive transfer in the serial communication.

The waveform creation logic module MT9 creates an output waveform according to the frequency-division signals C, D and J and address/data communication. That is, the pulse width of an output of the NAND circuit 26 becomes ½ bit cycle as indicated by $\overline{\text{CxD}}$ in FIG. 9, an output of the NAND circuit 28 becomes a signal having DATA superposed in the period of ½ bit cycle as indicated by $\overline{\text{DxDATA}}$ in FIG. 9, and an output of the final stage NOR circuit 30 having inverted inputs creates a 1 bit cycle as shown in FIG. 2B by combining the inputs as indicated by $\overline{\text{CxDxDxDATA}}$ in FIG. 9. The output signal is transmitted from the transistor TR1 to the slave side.

When the frequency-division signal J is input to the logic module MT9, a counter signal is set to clear the counter and the inverted two-successive transfer of a period of 8 bit cycles×4 (refer to FIG. 3A) is completed.

The slave receiving logic module 16 is operated as follows.

As shown in FIGS. 5 and 10 to 12, when inverted input data $\overline{DATA}$ is input to the slave receiving logic module 16, the counter SR1 clear signal $\overline{CxD}$ (FIG. 9) is reset by the clear logic module SR3 and the counter SR1 starts the frequency division of the clock and outputs frequency-division signals A, B, C and D (FIG. 9). The clear signal $\overline{CxD}$ is held in the logic module SR3 until $\overline{DATA}$ is next input.

When input of the input data $\overline{DATA}$ is interrupted and the frequency-division signal of the counter SR1 becomes a preset value, the counter SR1 clear signal (inverted signal of the counter SR2) is set (FIG. 9) and the counter SR2 starts to count the clock. When the frequency-division signal E is output (2 bit cycles have elapsed), the counter SR4 and the latches SR6 to SR9 are cleared.

Further, the clear logic module SR3 outputs a data latch signal $\overline{DxDATA}$ and a count-up signal $\overline{CxDxDxDATA}$ (FIG. 9) according to the frequency divisions from the counter SR1, the counter SR4 starts the counting operation by the count-up signal to output frequency-division signals A, B, C, D and E (FIGS. 11 and 12) thereof to the latches SR6 to SR9 and selector SR5. Data can be latched by the data latch signal $\overline{DxDATA}$ (FIG. 9) during the ½ bit cycle after the leading edge of the trigger pulse of 1 bit cycle. The selector SR5 outputs a latch signal to the chip selector CS of any one of the latches SR6 to SR9 according to the frequency-division signals D and E (FIG. 12) and the latch signal of the logic module SR3. The selection mode set at this time is expressed by portions of the D and E codes of FIG. 12.

Each of the latches SR6 to SR9 latches data into bits specified by the frequency-division signals A, B and C (FIG. 11) from the counter SR4 in response to a latch signal from the selector SR5. The latched data is held until a data clear signal (CLR: time up) is input. Bits latched in the latches SR6 to SR9 are indicated by portions of the A, B and C codes of FIG. 11 by a combination of the frequency-division signals A, B and C obtained at this time.

A comparator SR10 checks whether the addresses latched in the latches SR6 and SR7 are equal to each other or not, outputs an address coincidence signal when the addresses are coincident to each other, and does not output an address coincidence signal when an abnormal condition due to the abnormal communication condition occurs and any one of the bits is different from a corresponding bit. A comparator SR11 checks whether data items latched in the latches SR8 and SR9 are equal to each other or not and outputs a data coincidence signal when the data items are coincident to each other. Further, a comparator SR12 checks whether the content specified by the address setting switch 34 and an address transmitted are equal to each other or not and outputs a board select signal when the address coincidence signal is input to the inverted $\overline{EN}$ terminal and P=Q. A write signal (FIG. 12) is output based on the board select signal and data coincidence signal and a readout signal (FIG. 12) is output based on the board select signal and the frequency-division signal E of the counter SR4, and the write operation is started in this slave, thereby permitting transmission of the slave transmitting logic module 18.

The slave transmitting logic module 18 is operated as follows. As shown in FIGS. 5 and 13, when a slave transmission signal (FIG. 13 corresponds to FIG. 11) from the slave receiving logic module 16 is input, the counter ST4 is released from the clear state and starts the counting operation to output frequency-division signals A to I. When the frequency-division signal I is output (at the time of termination of 16 bit cycles), the clock input is canceled and output of further data is inhibited.

The data selector ST1 selects one of 8-bit inputs according to the frequency-division signals E, F and G and outputs the same. In the selector ST1, input data is selected and the parity creation unit ST2 outputs a data parity. In the data selector ST3, the parity created in the selector ST2, an error bit informing the abnormal condition of the slave side transmission system and a termination command are selected.

The data selector ST5 outputs data of an input data bus when the frequency-division signal H is low and outputs command data when it is high. The waveform creation logic module ST6 creates an output waveform based on the frequency-division signals C and D and the data/command signal. That is, the pulse width of an output of the NAND circuit 36 becomes ½ bit cycle as indicated in FIG. 13, an output of the NAND circuit 38 becomes a signal having $\overline{DATA}$ superposed in the period of ½ bit cycle as indicated in FIG. 13, and an output of the NOR circuit 40 having inverting input terminals creates a 1 bit cycle as shown in FIG. 3B by combining the inputs as indicated in FIG. 13. The output signal is transmitted towards the master side via the NOR circuit 42 having inverting input terminals and the transistor TR3.

The master receiving logic module 6 (refer to FIG. 7) receiving the above transmitted signal is operated as follows.

FIG. 14 shows a waveform in the master receiving logic module 6. However, the input data, frequency-division signals of the counter MR1, data latch signal, data number count are the same as those in the slave receiving logic module shown in FIG. 11. In this case, the counter SR1 clear signal and counter SR2 clear signal in FIG. 10 are referred to as a counter MR1 clear signal and an all-reset signal is not used.

When inverted data $\overline{DATA}$ is input to the master receiving logic module 6, the counter MR1 clear signal is reset by the clear logic module MR2 and the counter MR1 starts the counting operation to output frequency-division signals A, B, C and D (not shown in FIG. 14, refer to FIG. 10). The clear logic module MR2 outputs latch signals $\overline{G1}$ and $\overline{G2}$, count-up signal, and counter MR1 clear signal according to the frequency-division output of the counter MR1 and the frequency-division signal D of the counter MR3. The clear signal is kept held until next inverted data $\overline{DATA}$ is input. The counter MR3 outputs counts obtained after starting to load data from the master side transmission unit down to the slave side transmission unit as frequency-division signals A, B, C and D to the output selection latches MR4 and MR6 and clear logic module MR2 in response to the count-up signal.

The output selection latch MR4 latches input data into bits specified by the frequency-division signals A, B and C of the counter MR3 at the timing of generation of the latch signal $\overline{G1}$ from the logic module MR2 and the output selection latch MR6 latches input data into bits specified by the frequency-division signals A, B and C of the counter MR3 at the timing of generation of the latch signal $\overline{G2}$ from the logic module MR2. The parity generator MR5 subjects the input data from the latch MR4 and the parity in the command to the sum check process and outputs the parity to the 3-state buffer MR8. The resultant parity always becomes constant if the data is correct.

The CPU 8 fetches data received via the 3-state buffer MR7 into its own register from the output selection latch MR4 and the CPU 8 fetches an address received via the 3state buffer MR8 into its own register from the output selection latch MR6.

As described above, data transfer between the master and slave side transmission units 2 and 3 can be attained and the slave side transmission unit can be constructed only by logic circuits without incorporating expensive parts such as a microprocessor therein.

In the above embodiment, the data latching operation is effected when ½ bit cycle has elapsed after the leading edge of the trigger pulse, but it is not limitative and the data latching operation can be effected at any time if data is transmitted after transmission of the trigger pulse.

According to the above embodiment, since a trigger pulse is output for each bit cycle of transmission data and then data follows the trigger pulse, the slave side transmission unit can be constructed only by a logic circuit without expensive circuit element such as microprocessor and thus reduce a cost. Also, since a trigger pulse is inserted in the transmission data for each bit cycle, a start bit and a stop bit which are inserted in each character in a conventional system are not required in the embodiment. As a result, the high-speed data transmission can be realized and the noise resistivity is extremely improved.

Next, another embodiment is explained with reference to FIG. 15.

According to this embodiment, a slave side transmission unit 102 has a network interface unit 104 therein and the interface unit 104 is connected to a network having a main computer via terminals 106 and 108 so as to permit data transmission and reception. In general, a plurality of slave side transmission units 102 are connected to the network. The slave side transmission units 102 are disposed at preset portions of the cleaning apparatus as shown in FIG. 2.

Each slave side transmission unit 102 is connected to a slave bus 110 and effects the transmission/reception of data and control signals with respect to terminal units such as various sensors and drivers disposed on the cleaning apparatus. For this purpose, the bus 110 has a 4-bit address line 112, 8-bit data input line 114, 8-bit data output line 116, and a control line 118 for transmitting a signal for permitting the read, write or reset operation, for example.

The network interface section 104 is connected to a board address setting unit 120 for setting an address used for specifying the slave side transmission unit 102.

An input terminal 122 used as the terminal unit is connected to an input selector 130 via an input side isolator 124, an input side interlock matrix 126 and an input side monitor 128 which is the feature of this invention and the selector 130 is connected to an address line 112, a data input line 114 and a control line 118 for reading in the slave bus 110.

Further, a latch 132 is connected to the address line 112, data output line 116 and the control line 118 for writing and the output stage thereof is connected to an output terminal 140 via an output side interlock matrix 134 associated with the input side interlock matrix 126, an output side monitor 136 which is the feature of this invention and an output side isolator 138.

The operation of monitoring signal conditions in the data input/output lines 114 and 116, that is, the operating conditions of various sensors and the like cannot be freely controlled from the slave side since the input/output of the slave side bus 110 is occupied by the computer on the network side. Therefore, in this embodiment, a slave sub-bus 142 exclusively used for monitoring is additionally and independently disposed along the slave bus 110. As the slave sub-bus 142, an 8-bit bus is used, for example, and it is connected to the interface unit 104 via a sub-operation unit 144. A sub-bus address selector 146 for 4-bit slave sub-bus, for example, is disposed along the slave sub-bus 142. The selector 146 is connected to the input side monitor unit 128 and output side monitor unit 136 via a chip selector 148 so as to select them. The output of each of the monitor units 128 and 136 is connected to the slave sub-bus 142 and can be monitored when required.

The sub-operation unit 144 is constructed as shown in FIG. 16. That is, the sub-operation unit 144 includes logic elements 158A and 158B to which a control signal of the slave sub-bus 142 and a write signal WR are respectively input and logic elements 158C and 158D which respectively receive output signals of the logic elements 158A and 158B as inputs. The output terminals of the logic elements 158C and 158D are respectively connected to an output logic module 152 and logic module 156 of the terminal unit 111. Further, in the sub-operation unit 144, a three-state buffer 150 for effecting data write-in/readout in response to a reset signal from the network interface unit 104 and a logic circuit 154 for receiving an address of the slave bus 142 and extracting the lower bits of the address are provided. That is, the sub-operation unit 144 connects the slave sub-bus 142 to the network interface unit 104.

Thus, in this embodiment, it is possible to write output data to the slave side transmission unit 102 from the slave sub-bus 142 side even when the network is down or at the time of debugging prior to connection of the network. The number indicated in the logic circuit is a product number of the element.

Figure 17:
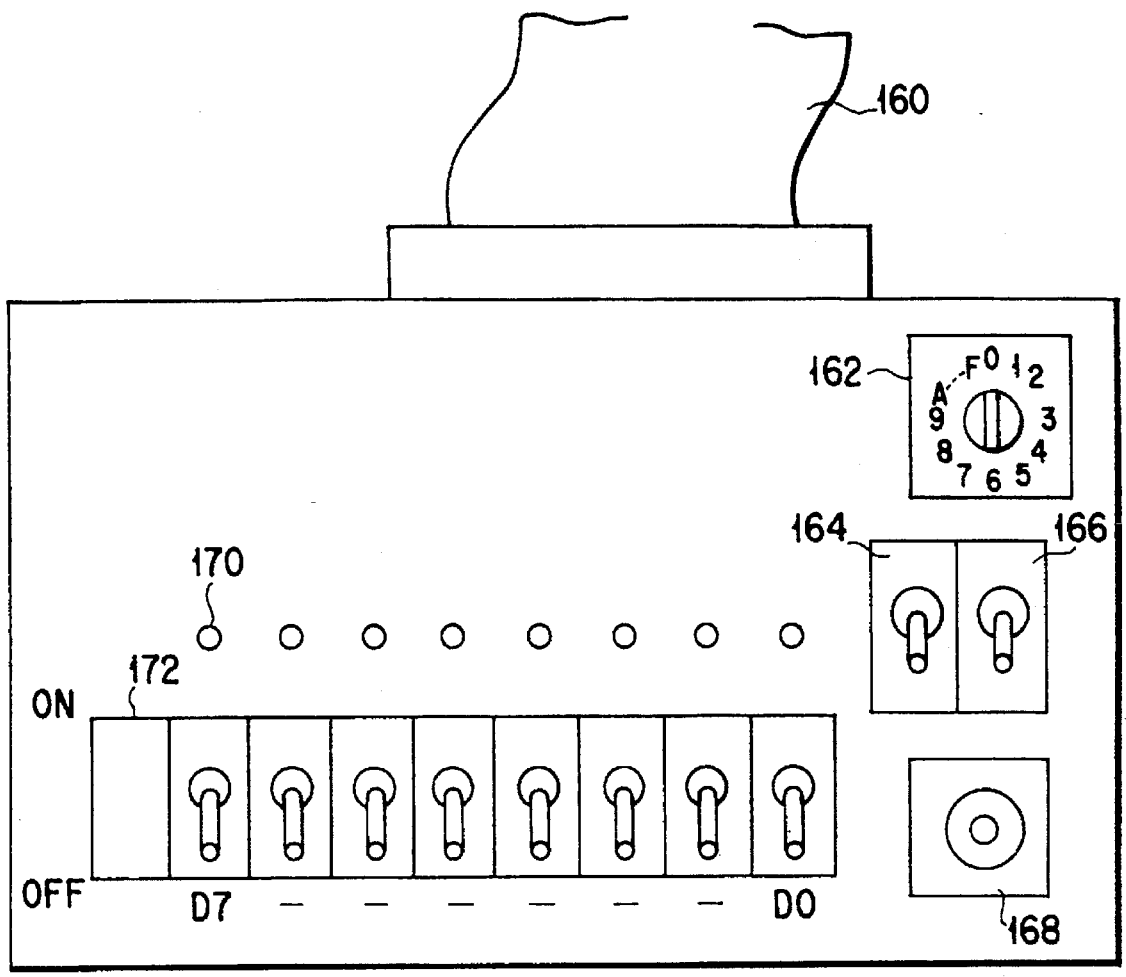
FIG. 17 is a front view of a monitoring jig.

FIG. 17 shows a monitoring jig for monitoring the data input/output line and writing output data in the slave side transmission unit 102 and the monitoring jig is connected to the sub-operation unit 144 via a connector 160.

The monitoring jig includes an address setting rotary switch 162 for switching data for every 8 bits by setting an address, a monitor/control selection switch 164, an I/O monitor read/write selection switch 166, a write switch 168 used at the time of write on the slave side, eight LED elements 170 turned ON/OFF according to 8-bit data and toggle switches 172 corresponding to the LED elements. In this embodiment, for example, four boards each having four channels are provided on the slave side, and 16 channels must be switched in order to monitor all of them, and the address setting rotary switch 162 is designed to switch 119 channels to serve the above purpose.

Figure 15:
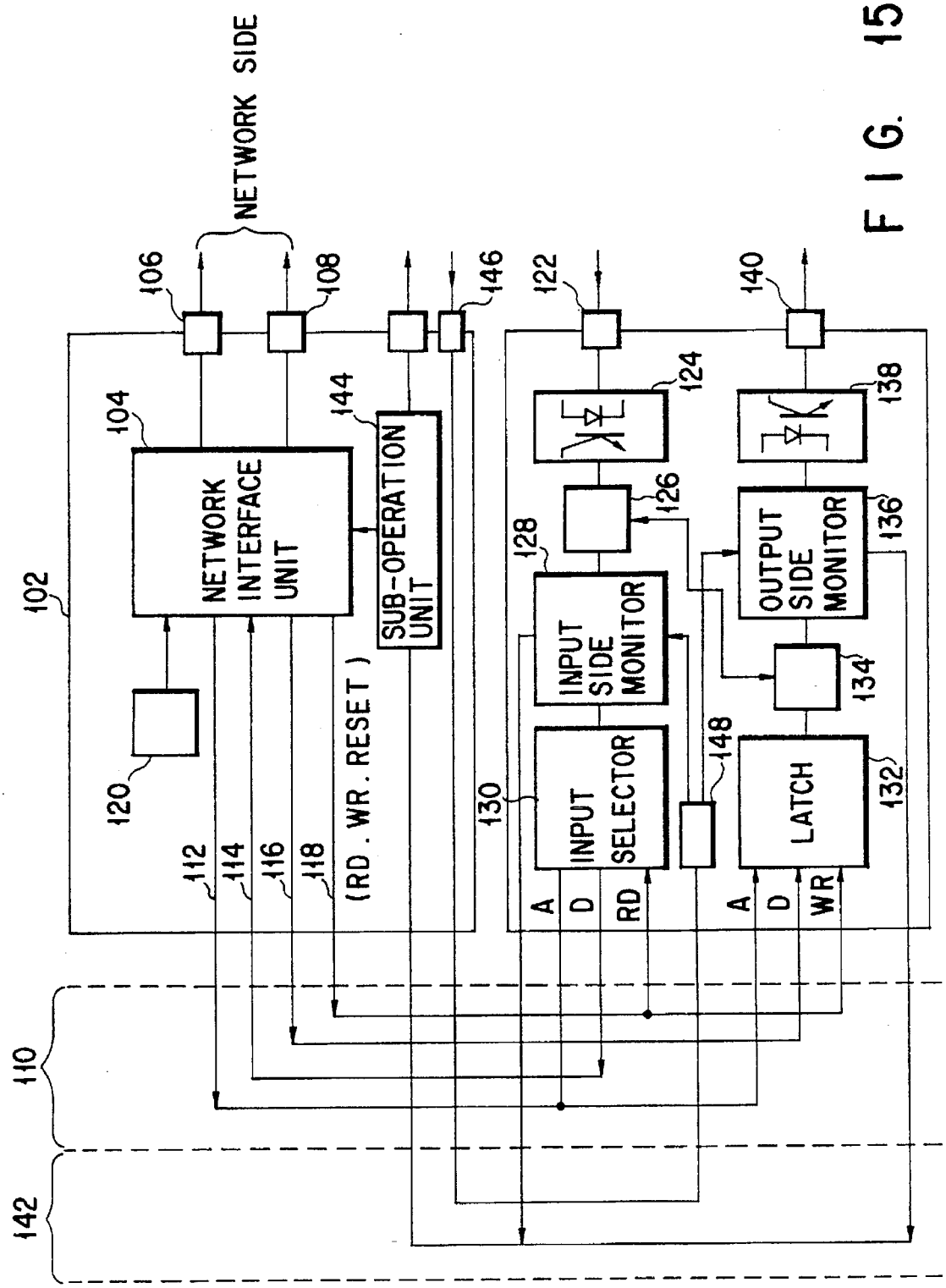
FIG. 15 is a schematic construction diagram of a slave side transmission unit of a communication system according to another embodiment.
Figure 18:
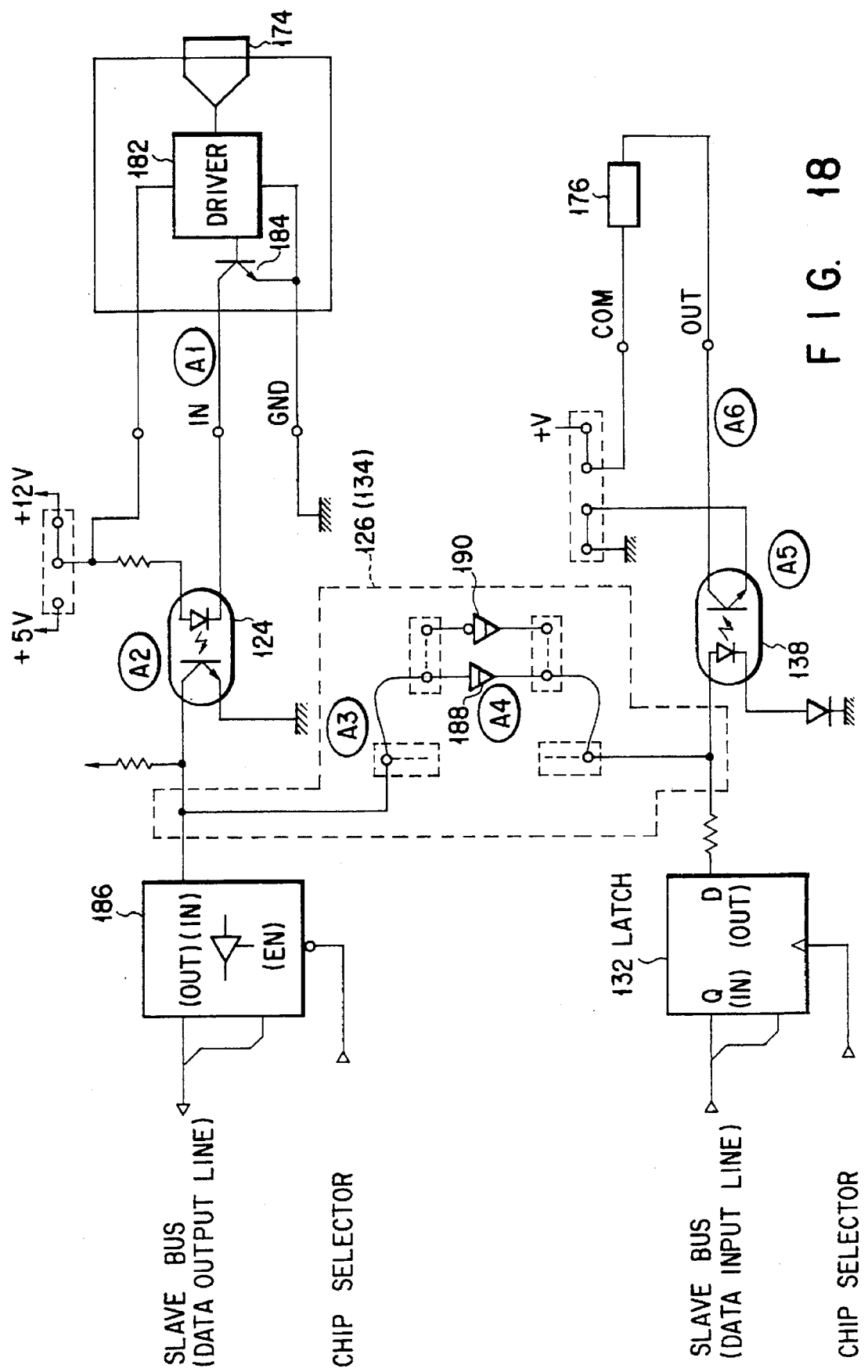
FIG. 18 is a diagram for illustrating an interlock system.
Figure 19:
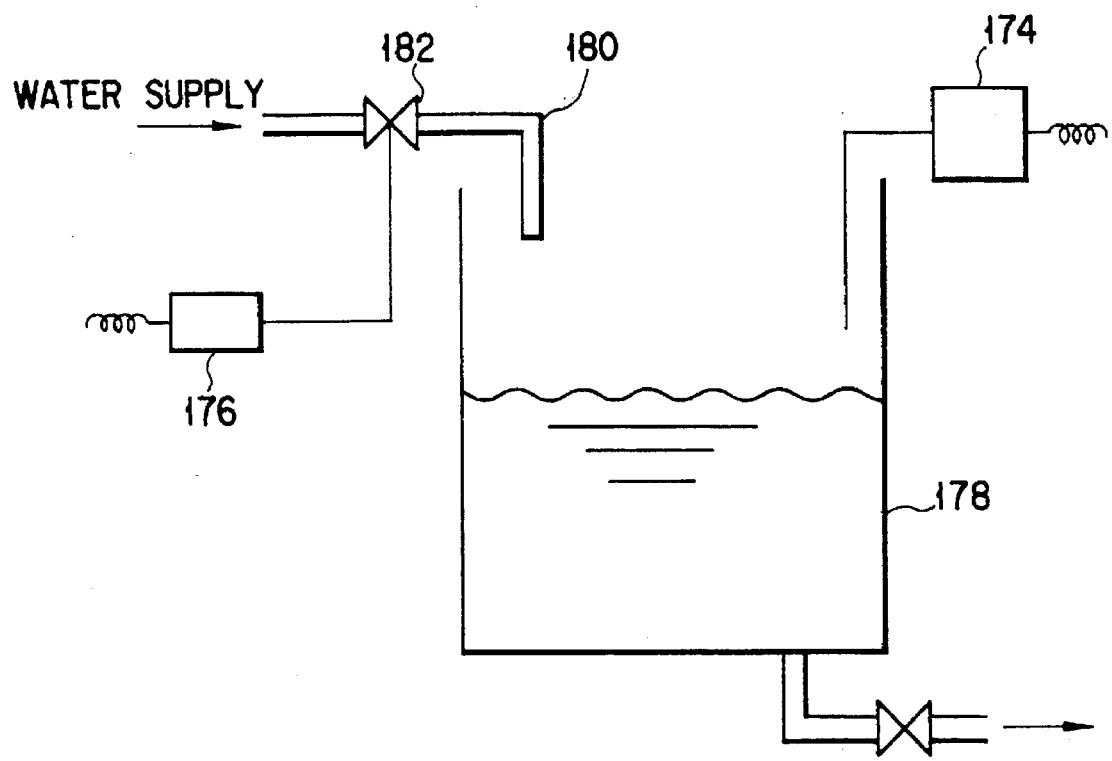
FIG. 19 is a diagram showing the relation between the solenoid and sensor used in the interlock system.

FIG. 18 is a diagram showing the interlock matrices 126 and 134 of FIG. 15, and portions which are the same as those of FIG. 15 are denoted by the same reference numerals. In this embodiment, the relation between a liquid level sensor 174 and a solenoid 176 for driving a valve disposed in a water supply line are used as an example. One example of an apparatus in which this type of interlock is used is shown in FIG. 19 and is an apparatus for controlling a valve 182 which opens or closes a water supply line 180 by use of the solenoid 176 when water is supplied into a tank 178 by use of the water supply line, for example, and at this time, the upper limit of water supply is detected by the liquid level sensor 174 and water supply of more than necessary is inhibited.

As shown in FIG. 18, the level sensor 174 is connected to a driving body such as a valve driver 182 supplied with an electric power of +12 V from the power source and the output of the valve driver 182 is connected to the base of a transistor 184. The collector of the transistor 184 is connected to a light emitting diode of an isolation (refer to FIG. 15) constructed by a photocoupler, for example. The light receiving element of the isolation 124 is connected to a data output line of the slave bus via a three-state buffer 186.

Further, the solenoid 176 is connected at one end to the power source and grounded at the other end via a transistor of an isolation 138 constructed by a photocoupler, for example, and the light emitting diode of the isolation 138 is connected to a latch 132 which is connected to the data input line of the slave bus, and when a solenoid driving signal is input, the light emitting diode turns ON the transistor of the isolation 138 so as to permit a driving current to flow in the solenoid 176.

In this case, if it is desired to change the channel to be monitored, the address setting rotary switch 162 is operated to change data for every eight bits and monitor data of another desired channel.

Further, in a case where output data is written in a condition that the network is down or at the time of debugging of the slave side transmission unit 102 before the network is connected, a desired address is specified by use of the rotary switch 162 and the monitor/control selection switch 164 is set to the control side, and the toggle switches 172 and write switch 168 are operated so as to write desired output data.

The interlock operation shown in FIG. 18 is effected in the operation mode shown in the Table 1.

TABLE 1

| CONDITION | | OPERATION | | | | | | OUTPUT |
|---|---|---|---|---|---|---|---|---|
| SENSOR | COMMAND | A1 | A2 | A3 | A4 | A5 | A6 | SOLENOID |
| NON-DETECTION (OFF) | OUTPUT (Hi) | Hi | OFF | Hi | OPEN | ON | LO | ON | OUTPUT ACCORDING TO COMMAND |
|  | NON-OUTPUT (LO) | Hi | OFF | Hi | OPEN | OFF | Hi | OFF |  |
| DETECTION (ON) | OUTPUT (HI) | LO | ON | LO | LO | OFF | Hi | OFF | ALWAYS OFF BY INTERLOCK |
|  | NON-OUTPUT (LO) | LO | ON | LO | LO | OFF | Hi | OFF |  |

A non-inverting open collector gate 188 is connected between a line between the isolation 124 and the three-state buffer 186 and a line between the latch 132 and the isolation 138. The open collector gate 188 is set into a high-impedance state when it is open and is set into the ON state when the input is low. Further, if this portion is used as a terminal and disposed together with an inverting open collector gate 190, the inverting open collector gate 190 may be used when the logic is inverted.

Next, the operation of the embodiment with the above construction is described.

First, in the normal operation in the system of FIG. 15, an address is determined by an address line 112, for example, and then a write enable signal or read enable signal is supplied via a control line 118 to determine the timing of the write or readout operation. For example, if four chips are provided for each of the input and output systems, four boards having eight bits are provided on the input side, four boards having eight bits are provided on the output side, and 64 data lines are provided in total. The chip is selected by the lower two bits of the address information of the address line 112 and corresponding data is input or output.

On the other hand, when the monitoring operation or data write operation is effected on the slave side, desired address information is supplied to a sub-address selector 146 so as to cause a chip selector 148 to create a chip selector signal. As a result, a board output of corresponding channel is supplied to a slave bus 142. The content of the output is monitored in the monitor sections 128 and 136. For example, as a sub-bus address signal used in this case, four bits are used, the upper two bits are used to select one of the four boards, and the lower two bits are used to select one of the four bytes. As a result, the LED elements 170 in the monitoring jig shown in FIG. 17 are turned ON and OFF according to data, and thus data can be monitored by visually observing the turn-ON/OFF states thereof.

In this example, a case wherein a driving command is input to the solenoid by an error signal in the control system to open the valve 182 for water supply in a condition that water in the tank 178 reaches the upper limit level and the liquid level sensor 174 detects this state is explained.

As shown in the above table, when the sensor 174 is set in the non-detection state (the water level does not reach the upper limit of water supply), the transistor 184 on the sensor side is set in the OFF state so that the potential of the point A1 will be set to the high level, the isolation 124 of the point A2 will be set in the OFF state, and the potential of the point A3 will be set to the high level. Therefore, the non-inverting open collector gate 188 which is the point A4 is set into the open state (high-impedance state). As a result, the isolation 138 which is the point A5 is turned ON and OFF in response to a command side signal and the solenoid is driven according to the command.

On the other hand, when the sensor 174 is set in the detection state (the water level has reached the upper limit of water supply), the transistor 184 on the sensor side is set in the ON state so that the potential of the point A1 will be set to the low level, the isolation, 124 of the point A2 will be set in the ON state, and the potential of the point A3 will be set to the low level. Therefore, the non-inverting open collector gate 188 of the point A4 is set to the low state, that is, it is set into the ON state. As a result, the isolation 138 which is the point A5 is kept in the low state irrespective of the high or low level of a command side signal and no current flows to maintain the OFF state. Therefore, since the potential of the point A6 is set in the high level, no current flows into the solenoid 176 from the power source side, thereby preventing the solenoid from being driven and interlocking the same.

In this case, if it is desired to invert the operation logic, an inverting open collector gate 190 may be used instead of the non-inverting open collector gate 188.

In the above embodiment, the input/output system of the control system of the semiconductor device manufacturing equipment is explained as an example, but this invention is not limited to the above system.

According to the above embodiment, since the monitoring slave bus is used, data in the slave bus can be monitored without interrupting the control of the network.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A communication system comprising:

a master side transmission unit having a master transmitting logic module and a master receiving logic module; and at least one slave side transmission unit connected to said master side transmission unit for communication with said master side transmission unit and having a slave transmitting logic module and a slave receiving logic module;

wherein each of said master transmitting logic module and said slave transmitting logic module transmits data including a trigger pulse and data item following the trigger pulse for each bit cycle, and each of said master transmitting logic module and said slave transmitting logic module output the trigger pulse with a width of approximately ¼ of one bit cycle for each bit cycle of data to be transmitted and output the data item for approximately ½ of one bit cycle after the trigger pulse, and each of said master receiving logic module and said slave receiving logic module latches the data item for each bit cycle when a preset length of time corresponding to approximately ½ of one bit cycle has elapsed after the leading edge of the trigger pulse.

2. A communication system according to claim 1, wherein each of said master transmitting logic module and said slave transmitting logic module has means for transmitting the data and inverted data of the data, and said slave receiving logic module has data check means for comparing the data with the inverted data to check for a data error.

3. A communication system according to claim 2, wherein said slave transmitting logic module has a data selector for selecting a data parity, an error bit for reporting an abnormal condition of the slave side transmission unit, and a termination command, in accordance with frequency-division signals generated in response to a slave transmission signal.

4. A communication system used in a semiconductor device manufacturing equipment including a cleaning apparatus having a plurality of process units, comprising:

a master side transmission unit having a master transmitting logic module and a master receiving logic module; and a plurality of slave side transmission units respectively mounted on at least some of said process units of said cleaning apparatus and connected to said master side transmission unit for communication with said master side transmission units, each of said slave side transmission units having a slave transmitting logic module and a slave receiving logic module;

wherein said master transmitting logic module and said slave transmitting logic module transmit data including a trigger pulse and a data item following the trigger pulse for each bit cycle, said master transmitting logic module and said slave transmitting logic module output the trigger pulse with a width of approximately ¼ of one bit cycle for each bit cycle of data to be transmitted and output the data item for approximately ½ of one bit cycle after the trigger pulse, and each of said master receiving logic module and said slave receiving logic module latches the data items for each bit cycle when a preset length of time corresponding to approximately ½ of one bit cycle has elapsed after the leading edge of the trigger pulse.

5. A communication system according to claim 4, wherein each of said master transmitting logic module and said slave transmitting logic module has means for transmitting the data and inverted data of the data, and said slave receiving logic module has data check means for comparing the data with the inverted data to check for a data error.

6. A communication system according to claim 5, wherein said slave transmitting logic module has a data selector for selecting a data parity, an error bit for reporting an abnormal condition of the slave side transmission unit, and a termination command, in accordance with frequency-division signals generated in response to a slave transmission signal.

* * * * *